(12) United States Patent
Clube et al.

(10) Patent No.: US 10,365,566 B2
(45) Date of Patent: Jul. 30, 2019

(54) METHODS AND SYSTEMS FOR PRINTING ARRAYS OF FEATURES

(71) Applicants: Francis Clube, Windisch (CH); Harun Solak, Brugg (CH)

(72) Inventors: Francis Clube, Windisch (CH); Harun Solak, Brugg (CH)

(73) Assignee: Eulitha A.G., Kirchdof (CH)

( * ) Notice: Subject to any disclaimer, the term of this patent is extended or adjusted under 35 U.S.C. 154(b) by 0 days.

(21) Appl. No.: 16/061,041

(22) PCT Filed: Dec. 14, 2016

(86) PCT No.: PCT/IB2016/057623
§ 371 (c)(1),
(2) Date: Jun. 11, 2018

(87) PCT Pub. No.: WO2017/103817
PCT Pub. Date: Jun. 22, 2017

(65) Prior Publication Data
US 2018/0364586 A1 Dec. 20, 2018

Related U.S. Application Data

(60) Provisional application No. 62/266,755, filed on Dec. 14, 2015.

(51) Int. Cl.
*G03F 7/20* (2006.01)

(52) U.S. Cl.
CPC ........ *G03F 7/70408* (2013.01); *G03F 7/7035* (2013.01); *G03F 7/70091* (2013.01)

(58) Field of Classification Search
CPC ............. G03F 7/70091; G03F 7/70283; G03F 7/7035; G03F 7/70408

(Continued)

(56) References Cited

U.S. PATENT DOCUMENTS

| 4,360,586 A | 11/1982 | Flanders et al. |
| 8,368,871 B2 | 2/2013 | Solak et al. |

(Continued)

FOREIGN PATENT DOCUMENTS

| WO | 2006045439 A2 | 5/2006 |
| WO | 2012066489 A2 | 5/2012 |

(Continued)

OTHER PUBLICATIONS

Fanke, C., et al. "Large Area Patterning for Photonic Crystals via Coherent Diffraction lithography", J. Vac. Sci. Technol. B22, 3352 (2004).

*Primary Examiner* — Colin W Kreutzer
(74) *Attorney, Agent, or Firm* — Laurence Greenberg; Werner Stemer; Ralph Locher

(57) ABSTRACT

A method for printing a desired periodic pattern into a photosensitive layer on a substrate includes providing a mask bearing a periodic pattern whose period is a multiple of that of the desired pattern. The substrate is disposed in proximity to the mask, at least one beam is provided for illuminating the mask pattern to generate a transmitted light-field described by a Talbot distance. The layer is exposed to time-integrated intensity distributions in a number of sub-exposures by illuminating the mask pattern with the at least one beam while changing the separation between substrate and mask by at least a certain fraction of, but less than, the Talbot distance. The illumination or the substrate is configured relative to the mask for the different sub-exposures so that the layer is exposed to the same time-integrated intensity distributions that are mutually laterally offset by a certain distance and in a certain direction.

27 Claims, 6 Drawing Sheets

(58) Field of Classification Search
USPC .............................. 355/67, 71, 77; 430/322
See application file for complete search history.

(56) References Cited

U.S. PATENT DOCUMENTS 8,525,973 B2   9/2013   Solak et al.
9,036,133 B2   5/2015   Solak et al.

FOREIGN PATENT DOCUMENTS

| WO | 2012085845 A1 | 6/2012 |
| WO | 2012095795 A2 | 7/2012 |
| WO | 2012164539 A1 | 12/2012 |
| WO | 2014147562 A2 | 9/2014 |

METHODS AND SYSTEMS FOR PRINTING ARRAYS OF FEATURES

BACKGROUND OF THE INVENTION

Field of the Invention

Lithographic fabrication enables the formation of micro- and nano-patterns on surfaces. Photolithographic techniques achieve this by exposing a photosensitive surface to a light-field with an intensity distribution corresponding to the desired pattern. For many applications patterns are required that comprise a unit cell of pattern features that repeat in one or two dimensions, that is, periodic patterns. A specialized photolithographic technique for transferring such patterns from masks onto substrates is based on the Talbot effect. When a periodic pattern defined in a mask is illuminated with a collimated beam of monochromatic light, diffraction orders in the transmitted light-field reconstruct "self-images" of the pattern at regular distances from the mask in so-called Talbot planes. The separation of these self-images, $L_T$, which is known as the Talbot distance, depends on the illumination wavelength, $\lambda$, and period of the pattern, $\Lambda$, according to:

$$L_T \approx \frac{k\Lambda^2}{\lambda} \qquad \text{equ. (1)}$$

where k is a constant.

For a one-dimensional periodic pattern of lines and spaces, k=2, whereas for two-dimensional periodic patterns, the value of k depends on the array symmetry of the pattern. Although this formula has good accuracy when $\Lambda \gg \lambda$ (i.e. when the angle of the first diffracted order is small), it approximates less well as the magnitude of $\Lambda$ approaches $\lambda$. Locating a photoresist-coated substrate at one of the self-image planes results in the mask pattern being printed into the photoresist (see, for example, C. Zanke, et al., "Large area patterning for photonic crystals via coherent diffraction lithography", J. Vac. Sci. Technol. B 22, 3352 (2004)). Furthermore, at intermediate distances between the self-image planes, Talbot sub-images are formed that have higher spatial frequencies than the pattern in the mask, which may be printed by placing a photoresist-coated substrate at one of these sub-image planes. The printed results achieved using these techniques are improved when the duty cycle of the mask pattern (i.e. the dimension of the features as a fraction of the feature period) is selected to produce a high contrast of intensity variation in the Talbot or sub-image plane (see U.S. Pat. No. 4,360,586). It is also known in the prior art that the contrast of the Talbot images can be further enhanced by fabricating the periodic patterns in the mask using phase shifting materials. Photolithography using Talbot imaging is especially advantageous for printing high-resolution periodic patterns in view of the cost of conventional, projection-type photolithographic systems for printing high-resolution patterns.

A problem with the Talbot technique, however, is that intensity distributions of the self-images and sub-images are sensitive to the distance from the mask, that is, they have a limited depth of field. This means that the substrate needs to be positioned accurately with respect to the mask in order for the pattern to be printed correctly. This becomes increasingly more difficult as the grating period is reduced because the depths of field of the self-images and sub-images are proportional to the square of the pattern period. Furthermore, if the pattern needs to be printed onto a substrate surface that is not very flat or onto a surface that already has a high-relief micro-microstructure, or into a thick layer of photoresist, then it may be impossible to achieve the desired result.

International patent application PCT/EP2005/010986 discloses two modifications of the Talbot imaging to overcome this problem. In the first, the periodic pattern in the mask is illuminated by a beam of collimated light beam from a source having a broad spectral bandwidth, and the wafer is positioned beyond a certain distance from the mask at which the image becomes "stationary", that is, its intensity distribution becomes substantially invariant to further increase in distance. The distance beyond which the image is stationary has been shown (Solak et al. "Achromatic spatial frequency multiplication: A method for production of nanometer-scale periodic features", J. Vac. Sci. Technol. B23(6), 2005) to be related to the full width at half maximum bandwidth, $\Delta\lambda$, by $$d \approx \frac{k\Lambda^2}{\Delta\lambda} \qquad \text{equ. (2)}$$

where k is a constant.

The exact value of this distance depends on the exact shape of the spectrum and may be calculated as described in the prior art. The technique has since been named "Achromatic Talbot lithography" (ATL). In the second, alternative modification of Talbot imaging, the periodic pattern in the mask is illuminated by a collimated beam of monochromatic light and the separation of the substrate and mask is varied during exposure by a distance corresponding to an integer multiple of the period of the periodic variation of the intensity distribution in the direction orthogonal to the mask, in other words, by an integer multiple of the Talbot distance. This prints an average of the transverse intensity distributions between the Talbot planes into the photosensitive layer on the substrate, and because the average is independent of the initial separation of the mask and substrate, the printed pattern has a practically unlimited depth of focus. According to this disclosure, the smallest change of separation required to produce the desired result is therefore the Talbot distance (when integer=1). The disclosure further teaches that the separation may be varied during exposure either continuously over this range or may be varied in a discrete way by exposing the substrate at multiple positions. This technique has since been named "Displacement Talbot lithography" (DTL).

The patterns printed using ATL and DTL are essentially the same and both enable high-resolution periodic pattern to be printed uniformly onto substrates that have poor surface flatness. For certain array types of periodic pattern the techniques print a "spatial-frequency multiplication" of the pattern in the mask. For example, in the case of a linear grating, the printed pattern has half the period (or twice the spatial frequency) of the grating in the mask. DTL, however, has certain advantages over ATL: it allows a much smaller separation between the substrate and mask, which improves the sharpness of the edges of periodic patterns, and facilitates the use of a laser source for generating high-intensity collimated beams, which enables a higher feature resolution and a shorter exposure time.

U.S. Pat. Nos. 8,368,871 and 9,036,133 teach modifications of the ATL and DTL techniques in which each point of the mask pattern is illuminated not by collimated light but by light having an extended angular distribution. In common with the DTL technique, however, they teach that the separation between the mask and substrate should be changed during exposure by at least the Talbot distance and most preferably by an integer multiple of the Talbot distance.

A difficulty with the above DTL and DTL-based exposure schemes, however, arises if the change of separation between the mask and substrate during exposure is not exactly an integer multiple of the Talbot distance. This may be caused by, for example, either mechanical hysteresis or limited stepping resolution of a displacement actuator, or by inexact synchronisation between the longitudinal displacement of the substrate or mask and the duration of the mask exposure. If this occurs then the time-integrated intensity distribution printed on the substrate does depend on the initial separation of the mask and substrate; and, because the mask and substrate are generally not flat and parallel, produces a non-uniform pattern. The non-uniformity can be reduced by changing the separation by a large integer multiple of Talbot distances, but this introduces other problems such as degradation of the feature resolution (if the illumination beam is not well collimated), distortion of the feature shape (if the direction of displacement is not accurately longitudinal), degradation of the pattern edges (if the gap becomes too large), and disadvantageously requires larger travel range in the mechanical system.

U.S. Pat. No. 8,525,973, which is incorporated herein by reference, discloses a solution to this problem. It teaches a modification of the DTL technique in which the exposure dose illuminating the mask per incremental change of separation between the mask and substrate is not constant during the change of separation but is varied by either changing the speed of displacement or by varying the intensity of the exposure beam. In particular it advocates that the exposure dose per incremental displacement of the substrate should be varied according to a Gaussian or similar profile, either by varying the illumination intensity according to the required profile or by varying the speed of displacement according to the inverse of the profile. It teaches that the change of separation over which the speed or intensity is varied should be greater than the Talbot distance. This modification of DTL has, however, certain disadvantages: varying the intensity of the illumination beam during exposure necessarily means that the output of the illumination source is not being optimally used which results in a longer exposure, whereas varying the speed of separation during exposure imposes additional requirements on the displacement mechanism which may be difficult and costly to provide, especially if the exposure time required is short and/or the substrate is large.

International patent application PCT/IB2011/055133 describes further modifications of the ATL and DTL techniques in which a variety of designs of phase-shift mask are employed to print patterns that have a smaller period or different array symmetry compared to that in the mask. In those embodiments in which different designs of phase-shift mask are combined with the DTL technique, it likewise teaches that the separation between the substrate and mask should be varied during exposure by at least the Talbot distance of the light-field diffracted by the mask.

International patent application PCT/IB2011/055827 describes an exposure method related to DTL in which a periodic pattern in a mask is tilted at a selected angle respect to a substrate to be printed, and then displaced with respect to the substrate during the exposure in the direction of tilt so as to expose the substrate to the range of transversal intensity distributions between successive Talbot planes. The resulting printed pattern is essentially the same as that produced by the ATL and DTL techniques, with the same advantages.

International patent application PCT/IB2012/050128 describes a related technique in which a periodic pattern in a mask is illuminated by an instantaneously monochromatic beam whose wavelength is scanned across a spectral bandwidth during the exposure of a substrate arranged in proximity to the mask. The bandwidth is arranged in relation to the separation of the substrate and mask so that the mean intensity distribution exposing the substrate is equivalent to that produced by ATL.

International patent application PCT/IB2012/052778 describes a further related technique in which an array of lasers emitting light at a plurality of wavelengths over a spectral bandwidth is employed to illuminate a periodic pattern in a mask in proximity to a substrate. The bandwidth of wavelengths and the separation of the substrate and the mask are arranged so that the resulting exposure of the substrate is equivalent to that produced by ATL.

Whereas the latter two techniques provide an alternative means to obtain an ATL-type exposure, they both add a complexity and associated cost to the illumination system that may be undesirable.

International patent application PCT/IB2014/059949 describes a further two related exposure schemes for printing a desired periodic pattern uniformly into a photosensitive layer on a substrate. In both schemes a mask bearing a periodic pattern is arranged in proximity to the substrate and illuminated with a beam of collimated monochromatic light, and the period of the mask pattern is selected in relation to the illumination wavelength so that most preferably only $0^{th}$ and $1^{st}$ orders are diffracted by the mask.

In the first exposure scheme, N sub-exposures of the mask are performed with the separation between mask and substrate being changed between sub-exposures so that the separation for the ith sub-exposure relative to that during the 1st sub-exposure is given by $(m_i + n_i/N)$ times the Talbot distance, where $m_i$ is an integer and $n_i$ takes each of the integer values from 0 to N−1 for the different sub-exposures. For example, if N=2 and $m_1$=0 for the $2^{nd}$ sub-exposure, then the separation is changed by ½ of the Talbot distance between the two sub-exposures; or if, N=3 and $m_1$=$m_2$=0 for the $2^{nd}$ and $3^{rd}$ sub-exposures, then the separation is changed by ⅓ of the Talbot distance between the first and second sub-exposures and by a further ⅓ of the Talbot distance between the second and third sub-exposures.

In the second scheme, the photosensitive layer is exposed in a first sub-exposure to the intensity distribution formed at the layer by the mask pattern. If the periodic mask pattern is a linear grating, the photosensitive layer is then exposed in a second sub-exposure to the same intensity distribution that is laterally offset at the layer with respect to the first sub-exposure by a distance of half the period of the grating and in a direction that is orthogonal to the grating lines. If the periodic mask pattern is instead a hexagonal array of features, then the layer is exposed in each of two further sub-exposures to the same intensity distribution as the first sub-exposure that is laterally offset at the layer with respect to the first sub-exposure by certain prescribed distances and in certain prescribed directions. An equivalent procedure is taught for the case that the periodic mask pattern is a square array of features.

With both of these exposure schemes the sum of the intensity distributions of the sub-exposures prints a pattern that is insensitive to the initial separation of the substrate and mask; and so, like DTL, enables periodic patterns to be printed uniformly onto substrates that are not very flat. The disclosure teaches that complete insensitivity of the printed pattern to the initial separation of the substrate and mask requires that the mask diffracts only $0^{th}$ and $1^{st}$ orders. Indeed in all of the detailed embodiments, the period of the mask pattern is selected in relation to the wavelength so that only $0^{th}$ and $1^{st}$ orders are diffracted by the mask. It further mentions that the presence of $2^{nd}$ or higher diffracted orders in the light-field diffracted by the mask results in a variation of the printed feature size, that is, non-uniformity, though this can be tolerated if the variation is less than one-tenth or one twentieth of the size of the feature.

An advantage of both schemes disclosed in PCT/IB2014/059949 is that the period of the printed pattern is less than the period of the pattern in the mask: in the case of a linear grating, the printed pattern has half the period, in the case of the two-dimensional hexagonal and square arrays the period of the printed patterns are respectively $\sqrt{3}$ and $\sqrt{2}$ smaller than the pattern in the mask. This means the size of the features required in the mask is significantly larger than those in desired printed pattern which facilitates and reduces considerably the cost of mask fabrication. An additional advantage of the second scheme over DTL is that it does not require the separation of the substrate and mask to be changed during the exposure by at least the Talbot distance.

The main disadvantage of the two schemes is that they are essentially limited to mask patterns whose periods are small enough in relation to the wavelength so that only $0^{th}$ and $1^{st}$ orders are diffracted. If the mask patterns are linear gratings this condition requires that the grating period is less than twice the illumination wavelength, whereas if the patterns are two-dimensional hexagonal arrays of features it requires that that the nearest-neighbour distance of the array features is less than twice the illumination wavelength, and for square arrays that the period is less than twice the illumination wavelength. Patterns whose periods or nearest-neighbour distances are larger in relation to the wavelength result in higher than $1^{st}$ diffraction orders which degrade the uniformity of the printed result. Because the magnitude of the resulting variation of printed feature size is approximately proportional to the ratio of the sum of the amplitudes of the higher orders to the sum of the amplitudes of the $1^{st}$ orders, the uniformity of the printed pattern is very sensitive to the higher orders: even a few very weak higher orders can produce a variation of feature size that is greater than one tenth of the feature size, which would generally be considered as unacceptable non-uniformity. Consequently, if the period or nearest-neighbour distance of the mask pattern is much larger than twice the illumination wavelength such that many higher orders are diffracted by the mask then the printed pattern would be highly non-uniform and no use for any application in the field.

Additionally, a disadvantage of the ATL technique is that it requires an illumination source that produces light with sufficiently large spectral bandwidth that can be well collimated without unacceptable loss of beam intensity: good collimation and large bandwidth are necessary for avoiding unacceptable blurring of the printed pattern. Such sources, however, are not readily available: light from LEDs, for example, has large spectral bandwidth but well collimated beams cannot be obtained without sacrificing beam intensity. It is therefore an object of the present invention to provide a method for printing a periodic pattern that has the same or similar advantages as the second exposure scheme disclosed on PCT/IB2014/059949, that is, the ability to print patterns uniformly onto non-flat substrates without requiring the separation of the substrate and mask to be varied by at least the Talbot distance, and the ability to print a pattern with a period that is smaller than that of the pattern in the mask; but without the main disadvantage of that scheme, that is, its effective limitation to mask patterns whose period is small enough in relation to the illumination wavelength such that only $0^{th}$ and $1^{st}$ orders are diffracted by the mask. In particular, it is an object of the present invention that the presence of higher diffracted orders in the light-field transmitted by the mask introduces no variation of feature size into the printed pattern.

It is a further object to provide a method and apparatus whose light source is monochromatic so that a laser source, which has certain desirable characteristics for industrial application, can be employed.

It is a further object that the method and apparatus be applicable to both one-dimensional and two-dimensional periodic patterns, especially to linear gratings, hexagonal and square arrays of features, and applicable also to quasi-periodic patterns whose period or nearest-neighbour distance varies slowly across the pattern.

It is yet a further object of the invention to reduce the requirement on the spectral bandwidth of the illumination source for performing achromatic Talbot lithography in order to facilitate the provision of a source that enables a well-collimated beam with high intensity so that higher-resolution patterns to be printed in a shorter exposure time than is possible using the prior art.

SUMMARY OF THE INVENTION

According to a first aspect of the present invention, a method is provided for printing a desired one-dimensional periodic pattern into a photosensitive layer, which method includes:

a) providing a mask bearing a periodic mask pattern of linear features whose period is twice that of the desired one-dimensional periodic pattern;

b) providing a substrate bearing the photosensitive layer;

c) disposing the substrate parallel and in proximity to the mask;

d) providing at least one beam of collimated monochromatic light for illuminating said mask pattern to generate a transmitted light-field described by a Talbot distance;

e) exposing the photosensitive layer to a time-integrated intensity distribution of a first sub-exposure and a time-integrated intensity distribution of a second sub-exposure, wherein said time-integrated intensity distributions are substantially the same and are formed by illuminating the mask pattern with the at least one beam while changing the separation between the substrate and mask by a distance that is at least one quarter of, and less than, the Talbot distance;

f) configuring the at least one beam or the lateral positions of the substrate relative to the mask for the first and second sub-exposures so that the exposures of the photosensitive layer by the time-integrated intensity distributions of the first and second sub-exposures are mutually laterally offset on the layer by a distance of half of the period of the mask pattern, or by an equivalent distance, in a direction orthogonal to the linear features;

wherein the period of the mask pattern is larger than twice the wavelength of the illumination beam such that the illuminated mask generates $0^{th}$, $1^{st}$ and higher diffraction orders.

The exposures of the photosensitive layer by the first and second sub-exposures are preferably mutually laterally offset on the layer by half the period of the mask pattern in the direction orthogonal to the linear features because this minimises the offset distance required. The mask pattern is periodic, however, so equivalent offset distances given by (n+0.5) times the grating period, where n is an integer, may be alternatively employed. Such an equivalent offset distance produces essentially the same printed result on the substrate.

According to a second aspect of the present invention, a method is provided for printing a desired two-dimensional periodic pattern of features in a hexagonal array into a photosensitive layer, which method includes:

a) providing a mask bearing a periodic mask pattern of features in a hexagonal array having a nearest-neighbour distance that is √3 times larger that of the desired two-dimensional pattern;

b) providing a substrate bearing the photosensitive layer;

c) disposing the substrate parallel and in proximity to the mask;

d) providing at least one beam of collimated monochromatic light for illuminating said mask pattern to generate a transmitted light-field described by a Talbot distance;

e) exposing the photosensitive layer to a time-integrated intensity distribution of a first sub-exposure, a time-integrated intensity distribution of a second sub-exposure and a time-integrated intensity distribution of a third sub-exposure, wherein said time-integrated intensity distributions are substantially the same and are formed by illuminating the mask pattern with the at least one beam while changing the separation between the substrate and mask by a distance that is at least one third of, and less than, the Talbot distance;

f) configuring the at least one beam or the lateral positions of the substrate relative to the mask for the first, second and third sub-exposures so that the exposures of the photosensitive layer by the time-integrated intensity distributions of the second and third sub-exposures are laterally offset from the exposure of the photosensitive layer by the time-integrated intensity distribution of the first sub-exposure by half of the nearest-neighbour distance of the mask pattern, or by equivalent distances, in a direction parallel to a row of features in the mask pattern, and by respectively $1/(2\sqrt{3})$ and $-1/(2\sqrt{3})$ times the nearest-neighbour distance of the mask pattern, or by equivalent distances, in a direction orthogonal to said row of mask features;

wherein the nearest-neighbour distance of the mask pattern is larger than twice the wavelength of the illumination beam such that the illuminated mask generates $0^{th}$, $1^{st}$ and higher diffraction orders.

The exposures of the photosensitive layer by the time-integrated intensity distributions of second and third sub-exposures are preferably laterally offset from the exposure by the intensity distribution of the first sub-exposure by the particular distances specified above but, as for the first aspect of the invention, the mask pattern is periodic and so essentially the same printed result may be obtained by alternatively using equivalent offset distances corresponding to the respective periodicities of the pattern in the directions concerned.

According to a third aspect of the present invention, a method for printing a desired two-dimensional periodic pattern of features in a square array into a photosensitive layer, which method includes:

a) providing a mask bearing a periodic mask pattern of features in a square array whose period is √2 times larger than that of the period of the desired two-dimensional pattern;

b) providing a substrate bearing the photosensitive layer;

c) disposing the substrate parallel and in proximity to the mask;

d) providing at least one beam of collimated monochromatic light for illuminating said mask pattern to generate a transmitted light-field having a Talbot distance;

e) exposing the photosensitive layer to a time-integrated intensity distribution of a first sub-exposure and a time-integrated intensity distribution of a second sub-exposure, wherein said time-integrated intensity distributions are substantially the same and are formed by illuminating the mask pattern with the at least one beam while changing the separation between the substrate and mask by a distance that is at least one half of, and less than, the Talbot distance;

f) configuring the at least one beam or the lateral positions of the substrate relative to the mask for the first and second sub-exposures so that exposures of the photosensitive layer by the time-integrated intensity distributions of the first and second sub-exposures are mutually laterally offset on the layer by half of the period of the mask pattern, or by an equivalent distance, in a direction parallel to a row of features in the mask pattern, and by half of the period of the mask pattern, or by an equivalent distance, in a direction orthogonal to said row of mask features;

wherein the period of the mask pattern is larger than √2 times the wavelength of the illumination beam such that the illuminated mask generates $0^{th}$, $1^{st}$ and higher diffraction orders.

For all of the above aspects of the invention the separation may be changed at a constant speed while illuminating with a beam having a constant intensity such that the rate of change of dose with separation remains constant for each sub-exposure. In this case, the separation is preferably changed by an integer multiple of respectively one quarter, one third and one half of the Talbot distance for the linear grating, hexagonal array and square array whilst ensuring that the change of separation is less than the Talbot distance; so, in the case of the linear grating the integer may take any of the values 1, 2 and 3, in the case of the hexagonal array it may take either of values 1 and 2, and for the square array the value is restricted to 1.

Preferably, however, at least one of the rate of change of separation and the intensity of the illumination beam is varied for each sub-exposure such that the exposure dose with incremental change of separation varies over the change of separation. Most preferably, said variation has a truncated Gaussian, truncated sinusoidal, truncated triangular or similar profile; and preferably the full-width at half maximum of the profile is half of the change of separation.

The different sub-exposures may be performed sequentially. In this case the illumination beam preferably comprises a single beam of collimated light and the lateral offset(s) of the exposures of the photosensitive layer by the time-integrated intensity distributions of the different sub-exposures are obtained either by changing the angle of incidence of the beam between the sub-exposures such that the magnitude and direction of the change of angle produces the required lateral offset of the time-integrated intensity distribution at the substrate, or by displacing laterally at least one of the substrate and mask between the sub-exposures by the lateral offset required.

Advantageously, the different sub-exposures are performed simultaneously. In this case the illumination beam consists of a plurality of beams of collimated light that illuminate the mask at different angles of incidence, the angles being selected to produce the required lateral offset(s) of the time-integrated intensity distribution at the photosensitive layer for the different sub-exposures.

For all aspects of the invention the pattern features in the mask may be transparent features in an otherwise opaque layer, or may be opaque features in an otherwise transparent mask. Alternatively, both the features and the surrounding area may be transparent or semi-transparent, and formed in a material or materials whose relative thickness and/or depth at the features introduces a shift in phase of the light transmitted by the features relative to the light transmitted by the surrounding area, i.e. the pattern may be formed in a phase-shift mask.

According to a fourth aspect of the invention, a method is provided for printing a desired one-dimensional periodic pattern into a photosensitive layer, which method includes:

a) providing a mask bearing a periodic mask pattern of linear features whose period is twice that of the desired one-dimensional periodic pattern;

b) providing a substrate bearing the photosensitive layer;

c) providing at least one beam of collimated light having either a spectral bandwidth or a wavelength that can be varied over a spectral bandwidth;

d) disposing the substrate parallel to the mask and with a separation that is larger than one quarter of, and less than, the distance at which a stationary image would be formed by illuminating the mask pattern with one of the at least one beam having the spectral bandwidth;

e) exposing the photosensitive layer to a time-integrated intensity distribution of a first sub-exposure and a time-integrated intensity distribution of a second sub-exposure, wherein said time-integrated intensity distributions are substantially the same and are formed either by illuminating the mask pattern with the at least one beam of collimated light having the spectral bandwidth, or by illuminating the mask pattern with the at least one beam of collimated light having a wavelength and scanning the wavelength over the spectral bandwidth;

f) configuring the at least one beam or the lateral positions of the substrate relative to the mask for the first and second sub-exposures so that the exposures of the photosensitive layer by the time-integrated intensity distributions of the first and second sub-exposures are mutually laterally offset on the layer by a distance of half of the period of the mask pattern, or by an equivalent distance, in a direction orthogonal to the linear features;

wherein the period of the mask pattern is larger than twice the central wavelength of the illumination beam such that the illuminated mask generates $0^{th}$, $1^{st}$ and higher diffraction orders.

According to a fifth aspect of the invention, a method is provided for printing a desired two-dimensional periodic pattern of features in a hexagonal array into a photosensitive layer, which method includes:

a) providing a mask bearing a periodic mask pattern of features in a hexagonal array having a nearest-neighbour distance that is $\sqrt{3}$ times larger that of the desired two-dimensional pattern;

b) providing a substrate bearing the photosensitive layer;

c) providing at least one beam of collimated light having either a spectral bandwidth or a wavelength that can be varied over a spectral bandwidth;

d) disposing the substrate parallel to the mask and with a separation that is larger than one third of, and less than, the distance at which a stationary image would be formed by illuminating the mask pattern with one of the at least one beam having the spectral bandwidth;

e) exposing the photosensitive layer to a time-integrated intensity distribution of a first sub-exposure and a time-integrated intensity distribution of a second sub-exposure, wherein said time-integrated intensity distributions are substantially the same and are formed either by illuminating the mask pattern with the at least one beam of collimated light having the spectral bandwidth, or by illuminating the mask pattern with the at least one beam of collimated light having a wavelength and scanning the wavelength over the spectral bandwidth;

f) configuring the at least one beam or the lateral positions of the substrate relative to the mask for the first, second and third sub-exposures so that the exposures of the photosensitive layer by the intensity distributions of the second and third sub-exposures are laterally offset from the exposure of the photosensitive layer by the intensity distribution of the first sub-exposure by half the nearest-neighbour distance of the mask pattern, or by equivalent distances, in a direction parallel to a row of features in the mask pattern, and by respectively $1/(2\sqrt{3})$ and $-1/(2\sqrt{3})$ times the nearest-neighbour distance of the mask pattern, or by equivalent distances, in a direction orthogonal to said row of mask features;

wherein the nearest-neighbour distance of the mask pattern is larger than twice the wavelength of the illumination beam such that the illuminated mask generates $0^{th}$, $1^{st}$ and higher diffraction orders.

According to a sixth aspect of the invention, a method is provided for printing a desired two-dimensional periodic pattern of features in a square array into a photosensitive layer, which method includes:

a) providing a mask bearing a periodic mask pattern of features in a square array whose period is $\sqrt{2}$ times larger than that of the period of the desired two-dimensional pattern;

b) providing a substrate bearing the photosensitive layer;

c) providing at least one beam of collimated light having either a spectral bandwidth or a wavelength that can be scanned over a spectral bandwidth;

d) disposing the substrate parallel to the mask and with a separation that is larger than one half of, and less than, the distance at which a stationary image would be formed by illuminating the mask pattern with one of the at least one beam having the spectral bandwidth;

e) exposing the photosensitive layer to a time-integrated intensity distribution of a first sub-exposure and a time-integrated intensity distribution of a second sub-exposure, wherein said time-integrated intensity distributions are substantially the same and are formed either by illuminating the mask pattern with the at least one beam of collimated light having the spectral bandwidth, or by illuminating the mask pattern with the at least one beam of collimated light having a wavelength and scanning the wavelength over the spectral bandwidth;

f) configuring the at least one beam or the lateral positions of the substrate relative to the mask for the first and second sub-exposures so that the exposures of the photosensitive layer by the intensity distributions of the first and second sub-exposures are mutually laterally offset by half of the period of the mask pattern, or by an equivalent distance, in a direction parallel to a row of features in the mask pattern and by half of the period of the mask pattern, or by an equivalent distance, in a direction orthogonal to said row of mask features;

wherein the period of the mask pattern is larger than $\sqrt{2}$ times the wavelength of the illumination beam such that the illuminated mask generates $0^{th}$, $1^{st}$ and diffraction orders.

In all of the above aspects, there is no limitation on the number or relative intensity of the higher diffraction orders in relation to the $0^{th}$ and $1^{st}$ orders.

DESCRIPTION OF THE INVENTION

Figure 1:
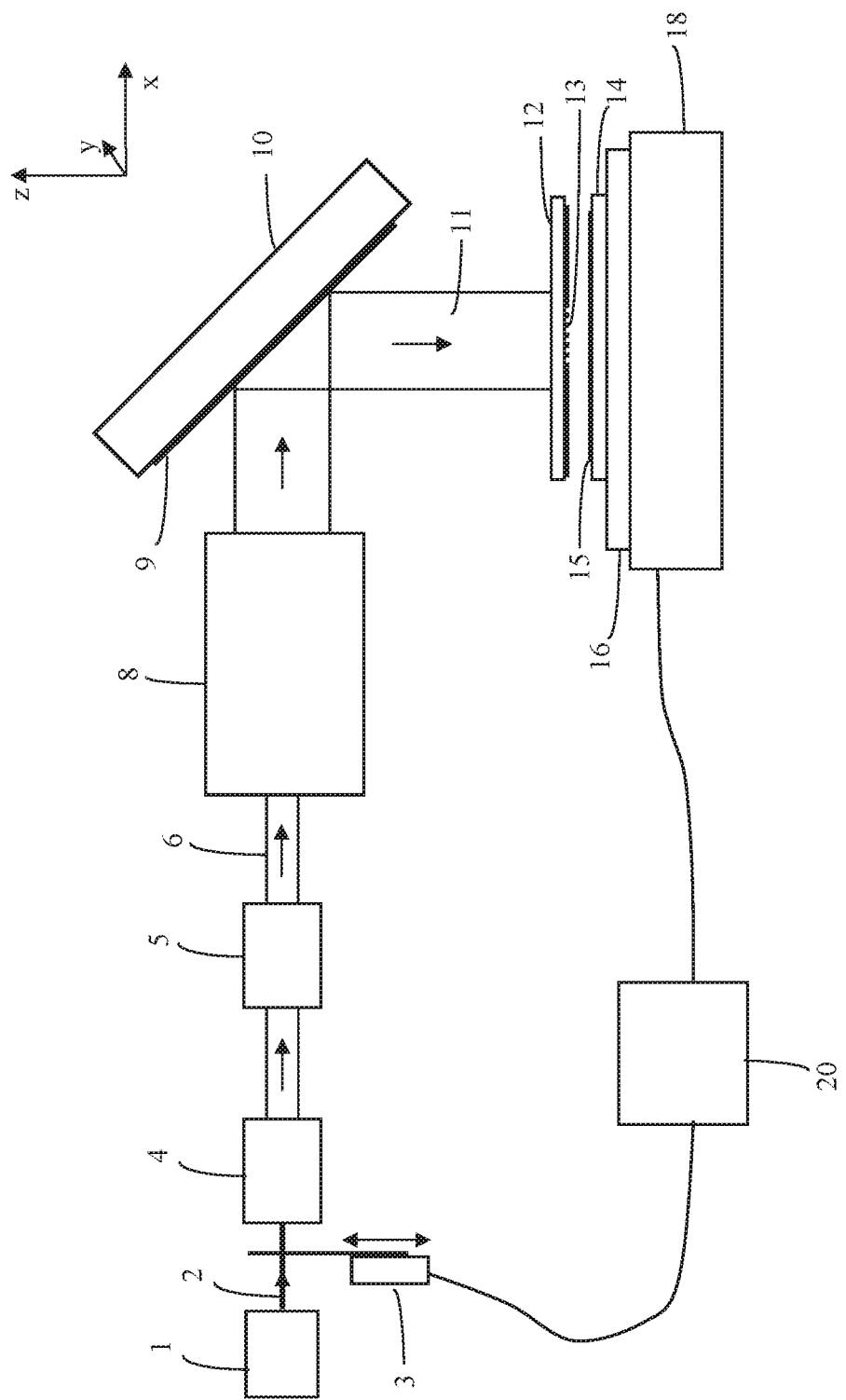
FIG. 1 illustrates different apparatuses employed in the first, second, third, fifth, sixth, seventh, eighth and ninth embodiments of the invention.

With reference to FIG. 1, which shows a first exemplary embodiment of the invention, an argon-ion laser 1 emits a beam of substantially monochromatic light 2 having a wavelength 363.8 nm and a diameter ~2 mm. The beam 2 is in TEM00 transverse mode, i.e. has a Gaussian intensity profile, and is plane-polarized. After passing through an electronically operated shutter 3 the beam's diameter is enlarged by an expander 4 comprising, for example, a plano-concave lens followed by a plano-convex lens for re-collimating the light. The expanded beam is then incident on a refractive beam-transformer 5 (of field mapping type) that converts the beam's Gaussian intensity profile to a substantially rectangular distribution. Such beam transformers are commercially available from such companies as Moltech GmbH, whose piShaper product range is dedicated to this application. The uniform beam of collimated light 6 from the transformer 5 is incident on a second beam expander 8 that enlarges the beam further so that its cross-section is larger than the pattern 13 to be exposed. The output beam from the expander 8 is reflected by a mirror 9 such that it illuminates a mask 12 at or near normal incidence. The mirror 9 is preferably mounted to a tilt stage 10 having adjustment means for angularly aligning the reflected beam normal to the mask.

As is well-known to a skilled person using the Talbot effect or techniques based thereon, such as DTL, for printing periodic patterns, it is necessary that the beam illuminating the mask pattern be well collimated and that the separation between mask and wafer be small enough so that the printed features are well resolved. The refractive beam transformer 5 advantageously produces a well collimated output beam so enables the range of angles of rays illuminating each point of the mask pattern 13 to be very small, such as <0.2 mR.

On the underside of the mask 12 is a one-dimensional periodic pattern 13, that is, a line-and-space structure in the form of a phase grating with a period of 4 µm that has been fabricated using standard methods. The line/space ratio is optimally 1 and the shift in phase of the transmitted light introduced by the etched lines is optimally π. The lines of the grating are oriented parallel to the y-axis, i.e. orthogonal to the plane of the figure. Whereas FIG. 1 shows only a few lines and spaces in the mask pattern 13, it should be understood that many more lines and spaces are present and that the dimensions of the pattern 13 are measured in centimeters. The illuminated grating 13 produces not just 0th and $1^{st}$ diffracted orders but up to the 10th orders. The orders interfere after the mask 12 to generate a sequence of Talbot images and sub-images. The Talbot distance of the interference pattern is calculated using equ. (1) to be 88 microns. The mask 12 is rigidly mounted to a mechanical support (not shown in the diagram) such as to the underside of a vacuum chuck.

Below the mask 12 is a silicon wafer 14 coated with a layer of a standard high-contrast i-line-sensitive photoresist 15 on its upper surface. The thickness of the layer 15 is ~1 µm. The wafer 14 is mounted to a vacuum chuck 16 that is attached to a positioning system 18 that has actuators for accurately changing the separation of the mask 12 and wafer 14 during the sub-exposures. Suitable actuators are piezoelectric transducers (PZTs). Preferably, each PZT has an integrated position sensor to allow closed-loop control so that accurate displacement can be reliably obtained. The positioning system 18 additionally includes actuators for accurately displacing the wafer 14 in the x and y directions. Suitable actuators are PZTs with a travel range of 20 µm, preferably also with closed-loop control to ensure accurate displacement. The positioning system 18 further includes a coarse-positioning mechanism for enabling the wafer 14 to be manually levelled with respect to the mask 12 and for their separation to be manually adjusted prior to exposure. The positioning system 18 and shutter 3 are connected to a control system 20.

The wafer 14 is arranged parallel to the mask 12 and with a separation of ~200 µm using reference spacers of known thickness (not shown in the figure) to manually probe and measure the gap between the mask 12 and wafer 14, and using the positioning system 18 to adjust the separation.

The wafer 14 is exposed in two sub-exposures. For the first sub-exposure, the shutter 3 is opened so as to illuminate the mask pattern 13 with the uniform beam of collimated light 11, and during exposure the fine-positioning actuators of the positioning system 18 are employed to change the separation with a constant speed in a manner similar to DTL except that the separation is reduced (or alternatively increased) by only one quarter of the Talbot distance of the transmitted light-field, i.e. by a distance of 22 µm, during the sub-exposure. The speed of the displacement is selected in relation to the intensity of the beam illuminating the mask 12 so that total exposure dose delivered by the two sub-exposures is suitable for forming the desired microstructures in the layer 15 of the particular photoresist material employed. The exposure time may be optimised when exposing subsequent wafers. The change of separation during the exposure causes the intensity distribution illuminating the photosensitive layer to vary. The spatial distribution of energy density that the layer 15 receives in the complete sub-exposure corresponds to a time-integration of the intensity distribution illuminating the layer 15.

At the end of the first sub-exposure, the shutter 3 is closed and the separation between the mask 12 and wafer 14 is accurately returned, using the actuators in wafer positioning stage 18, to its initial value. Also using the positioning stage 18, the wafer 14 is displaced in the x (or −x) direction by a distance of half of the period of the mask grating 13, i.e. by 2 μm.

The second sub-exposure then proceeds identically as the first sub-exposure by opening the shutter 3 and changing the wafer-mask separation at the same constant speed in the same direction for the same exposure time. The photoresist 15 is thereby exposed to essentially the same time-integrated intensity distribution as in the first sub-exposure except that it is laterally offset with respect to that of the first sub-exposure by half of the period of the mask grating 13 in the direction orthogonal to the grating lines. Following the exposure the shutter 3 is closed, the wafer 14 is removed from the exposure system and the photoresist 15 is developed using standard procedures.

The superposition of the two mutually offset time-integrated intensity distributions of the two sub-exposures can be mathematically shown to be given by:

$$I(x, z) = A_0^2 + 4\sum_{i=1}^{n} A_i^2 \cos^2\left(\frac{2\pi i x}{\Lambda}\right) \quad \text{equ. (3)}$$

where $A_i$ is the amplitude of the ith order diffracted from the mask grating 13, and n is the number of the highest diffracted order.

It is to be noticed that the resulting distribution has no dependence on the distance from the mask 12, so the printed pattern has an effectively unlimited depth of focus, thereby enabling the pattern to be printed uniformly onto wafers that have poor surface flatness.

Figure 2:
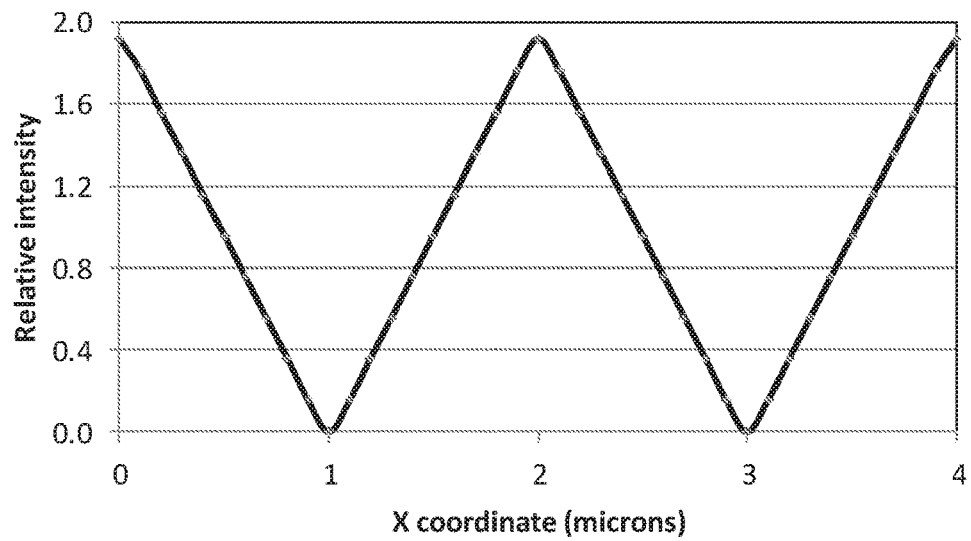
FIG. 2 shows a calculated result for the time-integrated intensity distribution that exposes a photoresist-coated wafer in the first embodiment.

Calculating firstly the amplitudes of the various diffracted orders for the linear grating 13 concerned and then I(x, z) yields the intensity profile shown in FIG. 2. The intensity plotted is relative to that incident on the mask. As can be seen, the intensity distribution has a substantially triangular profile with half of the period of the mask grating 13 and a contrast of ~100% which enables line-space structures with good profile to be formed in the developed photoresist 15. The line/space ratio of 1 and a phase-shift of π were selected for the linear grating 13 because they maximise the contrast of I(x, z). Significant deviations of the line/space ratio and phase shift from these values can be tolerated, however, because a production-worthy lithography process does not necessarily require such a high contrast.

The printed result is therefore equivalent to that produced by DTL exposure technique but it has been produced by changing the wafer-mask separation by only one quarter of that required by DTL. It therefore allows an actuator with a much shorter travel range to be employed, or conversely allows a much larger period of pattern to be printed using an actuator with a particular travel range. The smaller change of separation also reduces the magnitude of undesirable lateral displacement that may also occur during the longitudinal displacement, thereby improving the resolution of the printed features.

Since the mask pattern 13 of this embodiment is periodic in the x direction, the same printed result (neglecting the edges of the printed pattern) can be more generally obtained in this embodiment by displacing the wafer 14 between the two sub-exposures by a distance in the x direction given by (n+½)Λ, where n is an integer. These displacements, which correspond to the resulting lateral offsets of the time-integrated intensity distribution of the second sub-exposure, can therefore be described as equivalent. It is, however, advantageous that the displacement is minimised to Λ/2 (or −Λ/2) because this maximises the overlap of the two exposed areas of photoresist, and so maximises the area of the uniformly printed pattern. In view of non-perfect parallelism between the mask and wafer, minimising the lateral displacement is also advantageous for obtaining substantially the same distribution of local values of mask-wafer separation over the pattern area for the second sub-exposure as for the first sub-exposure, so that the time-integrated intensity distributions of the two sub-exposures at the photoresist layer are substantially the same. In this and other embodiments in which the periodic pattern in the mask is one-dimensional, i.e. a linear grating, the lateral offset required of (n+½)Λ in the x direction (orthogonal to the grating lines) may be accompanied by some arbitrary displacement in the y direction (parallel to the grating lines) that is preferably negligible in relation to the dimension of the pattern in this direction. Such an orthogonal displacement has negligible effect on the printed pattern because of the continuous nature of the grating lines in this direction.

In a variant of this embodiment, the mask-wafer separation is not returned to its initial value following the first sub-exposure but during the second exposure is instead changed with a constant speed in the opposite direction to that employed for the first sub-exposure. By switching the direction of changing separation for the second sub-exposure and employing the same variation of rate of change of exposure dose with separation as for the first sub-exposure, the resulting time-integrated intensity distribution exposing the photosensitive layer is the same. This procedural modification may be similarly applied to other embodiments.

In a further variant of this embodiment, essentially the same result may be alternatively obtained by changing the separation with constant speed during each sub-exposure so that the separation changes by an integer multiple of one-quarter of the Talbot distance where the integer is >1, but by less than one Talbot distance; that is, so that the separation changes by either 44 or 66 microns. Assuming the same beam intensity and photoresist process are employed, the speed of the change of separation should also be increased by a factor of 2 or 3 respectively so that the exposure dose delivered to the photoresist in the two sub-exposures remains suitable for forming the desired microstructures.

It is, of course, evident that in other variants of this embodiment, the displacement in x between sub-exposures may be performed by the mask 12 rather than the wafer 14: it is the relative displacement of the two that is important.

In yet another variant of this embodiment the mask bears instead an amplitude grating with the same or another period and a line/space ratio of preferably 1. It is fabricated using standard laser-beam or electron-beam mask making techniques. The exposure procedure is the same as for a phase mask with the same period, and the printed result is likewise a grating with half of the period of the mask grating. With an amplitude mask, however, the contrast of the sum of the time-integrated intensity distributions of the two sub-exposures is significantly less than that obtainable with a phase mask, which can be undesirable for applications requiring photoresist structures with a high aspect ratio.

This first embodiment has the same disadvantage as DTL and DTL-based techniques of the prior art in which the separation is changed with a constant speed during the exposure: the printed result is sensitive to a change of separation during the mask illumination that is not exactly an integer multiple of the desired distance. Such inaccuracy can occur if, for example, there is hysteresis in the longitudinal displacement of the wafer or if the shutter is not accurately synchronised with the displacement.

In a second embodiment, again with reference to FIG. 1, the laser source 1 is instead a diode-pumped solid-state laser that produces a frequency-tripled beam 2 with a Gaussian intensity profile at a wavelength of 355 nm. As in the first embodiment, the beam 2 passes through a shutter 3, a beam expander 4 and then a refractive beam transformer 5 that homogenizes the beam's intensity distribution. It is then similarly expanded further by the expander 8 and reflected by the mirror 9 so that the reflected collimated beam 11 illuminates a mask 12 at normal incidence.

On the underside of the mask 12 in this embodiment is a linear phase grating 13 with a phase depth of ~π for the wavelength concerned, a line/space ratio of ~1 and a period of 3.2 µm. The direction of the lines is orthogonal to the plane of the figure.

The illuminated linear grating 13 produces not just 0th and $1^{st}$ diffracted orders but up to the 9th orders, which interfere after the mask 12 to generate a sequence of Talbot images and sub-images whose Talbot distance is calculated to be 58 microns.

As in the first embodiment the exposure procedure consists of two sequential sub-exposures. However, instead of changing the separation with a constant speed during each sub-exposure, it is changed with a varying speed such that the exposure energy density illuminating the mask 12 per incremental change of separation varies during the change of separation according to a truncated Gaussian distribution given by $$\frac{\partial E_G(d)}{\partial d} = E_0 \exp\left\{\frac{-\ln 2(d-d_0)^2}{w^2}\right\}, \quad \text{equ. (4)}$$

$$\text{with } \frac{L_T}{8} \leq |d-d_0|_{max} < \frac{L_T}{2}$$

where $E_0$ is a constant, exp{ } represents the exponential function, w is the half width at half maximum of the Gaussian distribution, and $|d-d_0|_{max}$ defines the maximum allowed deviation of the separation either side of its mean value, $d_0$, during the sub-exposure.

The smallest distance by which the separation is changed in the sub-exposure is therefore $L_T/4$ and the largest is $L_T$. The lower limit ensures that the pattern is printed with a degree of uniformity whereas the upper limit satisfies the objective of obtaining good uniformity without changing of separation by the Talbot distance or more. Preferably though, the distance by which the separation is changed in the sub-exposure is at least $L_T/2$ so that very good uniformity is achieved, and less than $0.9L_T$ so that it is significantly smaller than the Talbot distance. For smaller changes of separation, from $L_T/2$ down to $L_T/4$, the uniformity of the printed pattern is progressively less good but can be still sufficient for less demanding applications. Preferably, the full width at half maximum of the Gaussian distribution, FWHM, is selected so that FWHM=2w≈|d−d$_0$| in order that $$\frac{\partial E_G(d)}{\partial d}$$

falls to ~6% of its peak value at the maximum and minimum values of separation. The FWHM is therefore preferably in the range $L_T/8$ to $L_T/2$ and most preferably in the range $L_T/4$ to $0.45L_T$.

Figure 3:
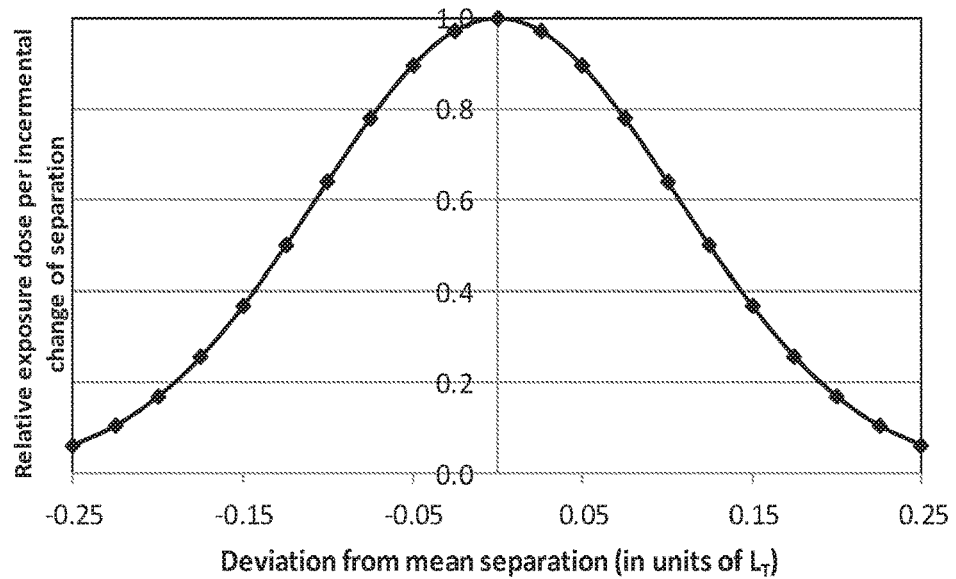
FIG. 3 illustrates the shape of a truncated Gaussian profile according to which the exposure dose per incremental change of separation is varied during the change of separation in the second embodiment.

With $$FWHM = 2w = |d-d_0|_{max} = \frac{L_T}{4},$$

the resulting truncated Gaussian distribution describing the normalised variation of exposure dose per incremental change of separation is as shown in FIG. 3. The values of separation along the abscissa axis of the plot in FIG. 3 are expressed as a deviation from the mean separation and in units of the Talbot distance, $L_T$.

This variation of the exposure dose with incremental change of separation is obtained by programming the control system 20 so that the actuators in the positioning system 18 displace the wafer 14 towards or away from the mask 12 during the exposure with a speed, v, that varies in the inverse manner, that is according to:

$$v_G(d) = v_0 \exp\left\{\frac{\ln 2(d-d_0)^2}{w^2}\right\}, \text{ with } \frac{L_T}{8} \leq |d-d_0|_{max} < \frac{L_T}{2} \quad \text{equ. (5)}$$

where $v_0$ is the speed at the mean value of separation. In view of the above, the distance, $2|d-d_0|_{max}$, by which the separation is changed during the sub-exposure in this embodiment is selected to be $L_T/2$, i.e. 29 microns, and the FWHM of the Gaussian distribution, 2w, is selected to be $L_T/4$, i.e. 14.5 microns.

The equation describing the displacements required of the actuator as a function of time is derived straightforwardly from equ. (5). The value of $v_0$ is selected in combination with the beam intensity so that the total exposure dose delivered to the photoresist 15 in the two sub-exposures is suitable for forming the desired microstructures. In order that the photoresist 15 is exposed only to the light-field transmitted by the mask 12 during the exposure defined by equ. (5), the opening and closing of the shutter 3 is synchronised by the control system 20 with the displacement of the actuators.

At the end of the first sub-exposure, the shutter 3 is closed, the separation between the mask 12 and wafer 14 is accurately returned to its initial value, and the wafer is displaced in the x direction, using the actuators in the wafer positioning stage 18, by a distance of half of the period of the mask grating 13, i.e. by 1.6 µm.

The second sub-exposure then proceeds in the same manner as the first by opening the shutter 3 and changing the separation during the sub-exposure in order to impart the same variation of the rate of change of exposure dose with gap. The wafer 14 is then removed from the exposure system, developed and inspected. The exposure dose may then be optimized by exposing subsequent wafers, either by adjusting the beam intensity or the value of the speed, $v_0$, at the mean separation.

The summation of the time-integrated intensity distributions of the two sub-exposures with a lateral offset of half of the period of the mask grating between the two distributions results in substantially the same triangular distribution as illustrated in FIG. 2 except with a period of half of the period of the mask grating, i.e. 1.6 µm. However, by varying in each sub-exposure the exposure dose per incremental change of separation according to a truncated Gaussian distribution, the sensitivity of the printed pattern to inaccurate longitudinal displacement of the substrate 14 and to inexact synchronisation of the wafer displacement with mask illumination are greatly reduced, thus enabling better uniformity and reproducibility than can be obtained by exposing with a rate of change of exposure dose with separation that remains constant over the change of separation.

A similar improvement to the uniformity and reproducibility of the printed pattern may be similarly obtained by alternatively programming the control system 20 to modulate the speed of displacement of the actuators during the exposure so that the exposure dose per incremental change of separation varies in a manner similar to a Gaussian profile, for example, according to a truncated sinusoidal function or a truncated triangular profile as are described in the prior art, especially in U.S. Pat. No. 8,525,973. For such alternative profiles, the upper and lower limits on the distance by which the separation should be changed during each sub-exposure, the preferred relative value of the FWHM of the curve describing the variation of exposure dose per incremental change of separation, and the preferred range by which the separation should be changed are the same as advocated above for the truncated Gaussian profile.

In a variant of this second embodiment, the variation of the exposure dose per incremental change of separation described by equ. (4) for a Gaussian profile may be equivalently obtained by varying instead the intensity of the beam illuminating the mask 12 according to equ. (4) whilst changing the separation between the wafer 14 and mask 12 with a constant speed. It may be similarly likewise equivalently obtained if the variation of the rate of change of exposure dose with separation is described by a truncated sinusoidal or truncated triangular profile. Such variations of beam intensity with changing separation may be obtained using the apparatus of FIG. 1 by including in the beam path a component, or combination of components, whose transmission (or reflectance) may be varied either continuously or in a stepped, quasi-continuous manner during each sub-exposure by the control system 20. For example, a circular continuously variable neutral density filter mounted to a motorised rotation stage may be included in the beam path just after the shutter 3, and the orientation of the filter continuously adjusted by the control system 20 during the exposure so that the desired variation of incremental exposure dose with wafer-mask separation is obtained. This variant of the second embodiment, however, has the disadvantage of not optimally using the output power of the laser so can lead to a longer exposure time.

In a third embodiment, substantially the same apparatus of FIG. 1 may be employed except that it is unnecessary that the wafer positioning stage 18 possess actuators for displacing the wafer in the x (or y) direction.

The separation between mask 12 and wafer 14 is firstly adjusted to ~300 µm. The first of two sub-exposures then proceeds in substantially the same manner as in the second embodiment with the separation between mask 12 and wafer 14 being changed, in the direction of reducing separation, with a varying speed over a distance of $L_T/2=29$ µm such that the exposure energy density per incremental change of separation varies according to a truncated Gaussian profile. The shutter 3 is then closed and the separation between the mask 12 and wafer 14 is accurately returned using the actuators in wafer positioning stage 18 to its initial value. Instead of displacing the wafer 14 between sub-exposures, the angle of the mirror 9 is adjusted using the tilt stage 10 in order that the angle of the beam 11 illuminating the mask 12 is changed in the xz plane by:

$$\Delta\omega \approx \frac{\Lambda}{2L} \text{radians} \qquad \text{equ. (6)}$$

where $\Lambda$ is the period of the mask grating 13, L is the mean wafer-mask separation during each sub-exposure.

So, for the values employed ($\Lambda$=3.2 µm and L=286 µm), $\Delta\omega$=5.6 mR. The second sub-exposure is then performed identically as the first.

Changing the angle of mask illumination by $\Delta\omega$ in the xz plane causes the instantaneous intensity distribution at a distance s from the mask 12 to laterally displace by a distance sΔω. So, if the change of separation during the sub-exposure is small in relation to the mean separation (preferably $\Delta s/2L<10\%$) then changing the angle of illumination between sub-exposures by that defined by equ. (6) produces substantially the same time-integrated intensity distribution at the photosensitive layer 15 but laterally offset from that printed in the first sub-exposure by $\Lambda/2$ in a direction orthogonal to the grating lines. In fact, the time-integrated intensity distributions printed in the two sub-exposures are the same if the bisector of the angles of incidence of the illumination beam 11 for the first and second sub-exposures is perpendicular to the mask 12 in the xz plane. The pattern printed in this embodiment is therefore essentially the same as that printed in the second embodiment in which the $\Lambda/2$ lateral offset between the time-integrated intensity distributions of the two sub-exposures is produced by displacing the wafer 14.

Since the mask pattern 14 is periodic in the x direction, substantially the same printed result can be more generally obtained in this embodiment by changing the angle of the illumination beam 11 in the xz plane between the two sub-exposures by $(n+½)\Lambda/L$, where n is an integer. It is, however, advantageous that the angular displacement is minimised to $\Lambda/2L$ (or $-\Lambda/2L$) because this maximises the overlap of the two exposed areas of photoresist, and so maximises the area of the uniformly printed pattern.

Evidently, in this embodiment the exposure dose per incremental change of separation may be alternatively varied in each sub-exposure according to a profile that is similar to a truncated Gaussian, such as a truncated sinusoidal or truncated triangular profile, to produce substantially the same printed result.

Figure 4:
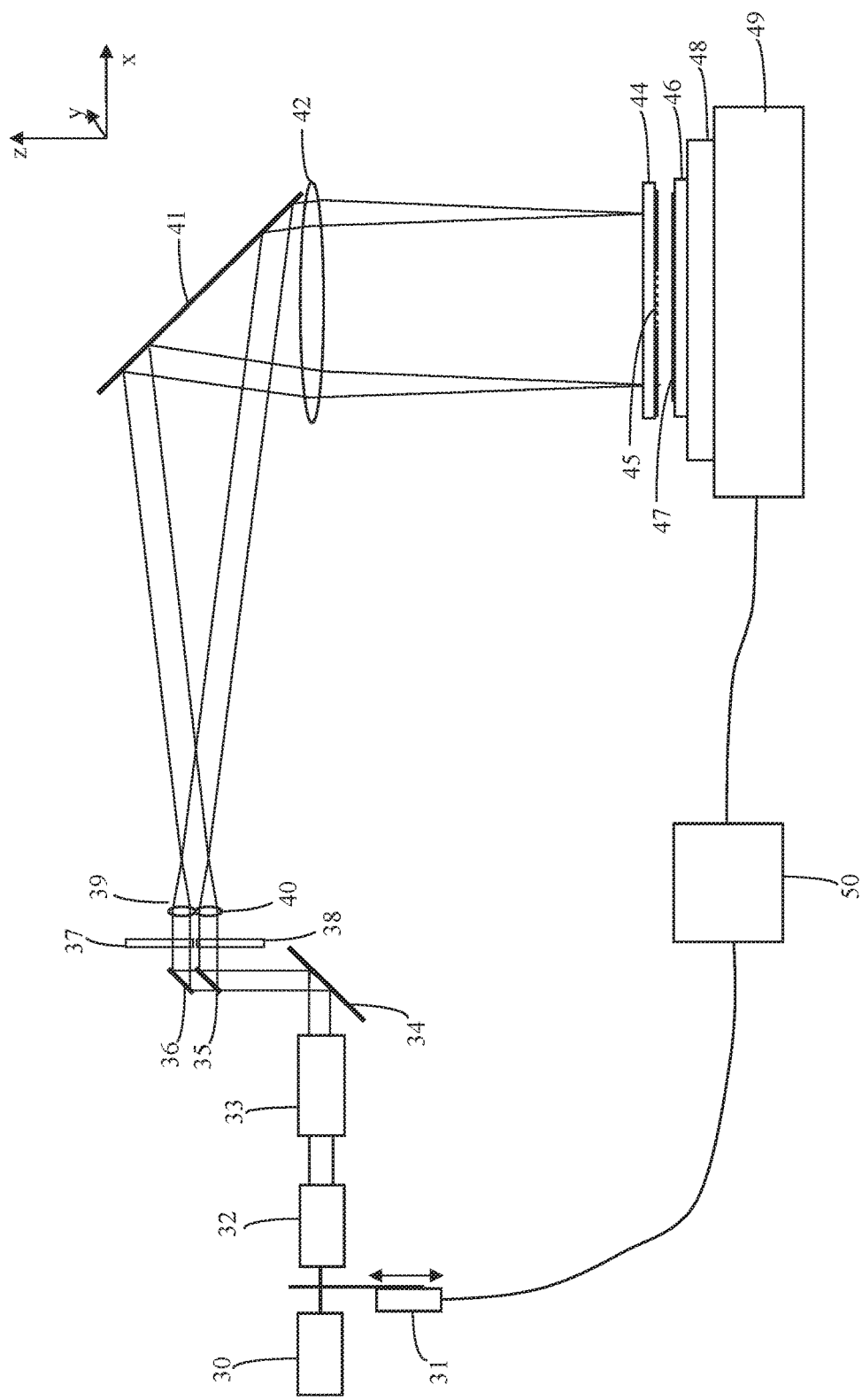
FIG. 4 illustrates an apparatus employed in the fourth embodiment of the invention.

In a fourth embodiment, with reference to FIG. 4, a diode-pumped solid-state laser 30 emits a frequency-tripled beam at a wavelength of 355 nm. The beam is plane-polarized and in TEM00 mode. The beam passes through a shutter 31, a beam expander 32 and a refractive beam transformer 33 (of the field mapping type) to produce a ~6 mm diameter collimated beam with a substantially rectangular intensity distribution. This is reflected by a mirror 34 onto a beam-splitter 35 that partially reflects the beam in an orthogonal direction, and the beam partially transmitted by the beam-splitter 35 is reflected in the same orthogonal direction by a mirror 36. The two reflected beams pass through a pair of filters 37, 38 whose respective transmissions can be adjusted in order to equalize the intensity of the two transmitted beams. Suitable filters are continuously variable neutral density filters that are commercially available from such companies as Thorlabs Inc. Such filters are not necessary in the exposure system if the partially reflected and partially transmitted beams from the beam-splitter have the same intensity to ~±2% (also one such filter may be sufficient). The two beams transmitted by the filters 37, 38 are then focussed by a pair of lenses 39, 40 that are laterally offset in z, and the divergent light beyond the focus of each beam is reflected by a mirror 41 onto a collimating lens 42. The lateral offset of the two foci, which are in the front focal plane of lens 42, produces two overlapping beams of collimated light after the lens 42 that are angularly offset in the xz plane. By arranging the offset distance to be 7.5 mm and selecting a lens 42 with focal length 1.2 meters, the resulting angular offset is 6.25 mR. The two collimated beams converge to illuminate a mask 44 close to normal incidence. Preferably, the tilt of the mirror 41 is adjusted so that the bisector of the two beams is normal to the mask 44. By arranging the difference in optical path lengths of the two beams from the beam-splitter 35 to the mask 44 to be larger than the coherence length of the light, the two beams do not interfere to produce an undesirable fringe pattern at the mask 44.

The mask 44 bears a linear phase grating 45 with a phase depth of ~$\pi$ for the wavelength concerned, a line/space ratio of ~1 and a period of 5 µm. The direction of the lines is orthogonal to the plane of the figure. The illuminated grating 45 produces not just 0th and $1^{st}$ diffracted orders but up to the 14th orders, which interfere after the mask 44 to generate a sequence of Talbot images and sub-images. The Talbot distance for the interference pattern is calculated using equ. (1) to be 141 microns.

Below the mask 44 is a wafer 46 coated with a layer of photoresist 47. The wafer 46 is mounted to a vacuum chuck 48 that is attached to a positioning system 49 that includes fine-positioning actuators under closed-loop control for longitudinally displacing the wafer during the exposure. Suitable actuators are piezo-electric transducers. The positioning system 49 and shutter 31 are connected to a control system 50. The positioning system 49 further includes a coarse-positioning mechanism for facilitating adjustment of the parallelism and separation of the mask 44 and wafer 46 prior to exposure.

In this embodiment two angularly offset beams of collimated light simultaneously illuminate the periodic pattern in the mask 44 and each exposes the wafer to a time-integrated intensity distribution. The exposure by each of the two beams may therefore be regarded as a sub-exposure, the two of which occur simultaneously rather than sequentially as in the previous embodiments. As in the previous embodiments, however, the separation between wafer and mask is varied during the mask exposure by at least one quarter of the Talbot distance but less than the Talbot distance. In order to minimise the sensitivity of the printed pattern to inaccurate longitudinal displacement of the wafer during exposure, the exposure dose per incremental change of separation is similarly selected to vary during the change of separation according to a truncated Gaussian distribution. As for the truncated Gaussian distribution employed in the previous embodiment, it is preferable that the separation is changed by at least $L_T/2$ so that very good uniformity is achieved, but less than $0.9L_T$; and furthermore that the FWHM of the truncated Gaussian distribution is half of the complete change of separation. Accordingly, for this embodiment the desired change of separation is $L_T/2$, i.e. 70 µm, and the desired FWHM of the truncated Gaussian distribution is $L_T/4$, i.e. 35 µm.

In order that the time-integrated intensity distributions produced by the two illumination beams are mutually offset at the photoresist layer 47 by half the period of the mask grating 45, i.e. by 2.5 µm, it is necessary, using equ. (6), that the mean separation of the wafer 46 and mask 44 during exposure is 400 µm. In view of the desired value for the change of separation during exposure (and the intention to change it in the direction of increasing separation), the separation is initially set, using the wafer positioning system, to ~$400-L_T/4$, i.e. ~365 µm. The exposure is performed by opening the shutter 31 and varying the speed of increasing separation according to equ. (5) with the above-stated parameter values and $v_0$ selected so that the time-integrated exposure dose delivered to the photoresist 47 in the exposure is suitable for forming the desired microstructures. At the end of the exposure the shutter 31 is closed and the wafer 46 is removed from the chuck 48 for development.

Since the mask pattern 45 is periodic in the x direction, substantially the same printed result can be more generally obtained in this embodiment by arranging that the angular offset between the two overlapping beams of collimated light illuminating the mask 44 is given by $(n+\frac{1}{2})\lambda/L$, where n is an integer. These angular offsets, and the resulting lateral offsets of the time-integrated intensity distribution of the second sub-exposure in relation to that of the first sub-exposure, are therefore equivalent. It is, however, advantageous that the angular offset is minimised to $\lambda/2L$ because this maximises the degree of overlap of the two exposed areas of photoresist 47, and so maximises the area of the uniformly printed pattern.

In a variant of this single-exposure embodiment, the separation between the wafer 46 and mask 44 is instead varied, as in the first embodiment, with a constant speed over a distance of $L_T/4$. In a variant of this embodiment, the light from the laser source may be divided into two beams other than by a classical beam-splitter; for example, it may be divided by a polarizing beam-splitter or by a diffractive element. Alternatively, the two beams may be derived from separate laser sources (of the same wavelength).

It should be understood that the lenses illustrated in FIG. 4, in common with the other features of the apparatus, are illustrated merely schematically, and that each of the lenses may, in fact, be, for example, a biconvex lens or a number of lens elements that are not necessarily in close proximity, the particular lens being designed in combination with the other optical elements of the exposure system to optimise the uniformity and collimation of the beam illuminating the mask according to the particular requirements of the application, as could be readily undertaken by one skilled in the art using standard principles of optical design.

Figure 5:
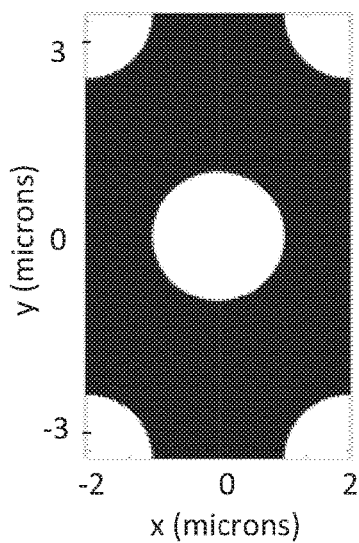
FIG. 5 illustrates a hexagonal array of holes in a mask employed in the fifth embodiment.

In a fifth embodiment, substantially the same apparatus as illustrated in FIG. 1 for the first embodiment is employed except that a quarter-wave plate is included in the beam path just after the shutter 3, and the mask 12 instead consists of a hexagonal array of holes of diameter 2 µm and nearest-neighbour distance of 4 µm that have been formed in a layer of chrome on a fused silica substrate. A unit cell of this pattern of holes in shown in FIG. 5. It should be noted that the features of the hexagonal array are arranged in rows that are oriented parallel to 3 axes: the x axis and axes at $\pm 60°$ with respect to the x axis. The mask pattern is oriented in the exposure system so that the x-axis labelled in FIG. 5 is in the direction of x-axis shown in FIG. 1. Illumination of this array with the wavelength concerned produces not just 0th and $1^{st}$ diffracted orders but up to the 9th orders (note: in the case of a hexagonal array, if the nearest-neighbour distance is larger than twice the wavelength then at least a double-diffracted set of orders propagates in addition to the $0^{th}$ and $1^{st}$ orders). The diffraction orders interfere after the mask to produce Talbot images of the mask pattern at periodic distances from the mask. The quarter-wave plate converts the linearly polarized incident beam to one that is circularly polarized, which ensures that the distribution of order intensities diffracted by the mask has 3-fold symmetry, so that the time-integrated intensity peaks exposing the photoresist are correspondingly symmetric, which is generally desired. For some applications, however, such symmetric intensity peaks may be unimportant, in which case the quarter-wave plate (or an equivalent element) may be excluded from the exposure system.

The Talbot distance, $L_T$, for a hexagonal array may be calculated from equ. (1) with k=1.5 and with $\Lambda$ referring to the nearest-neighbour distance of the array features. Evaluating with $\lambda$=364 nm and $\Lambda$=4 µm yields $L_T$=66 µm.

Figure 6:
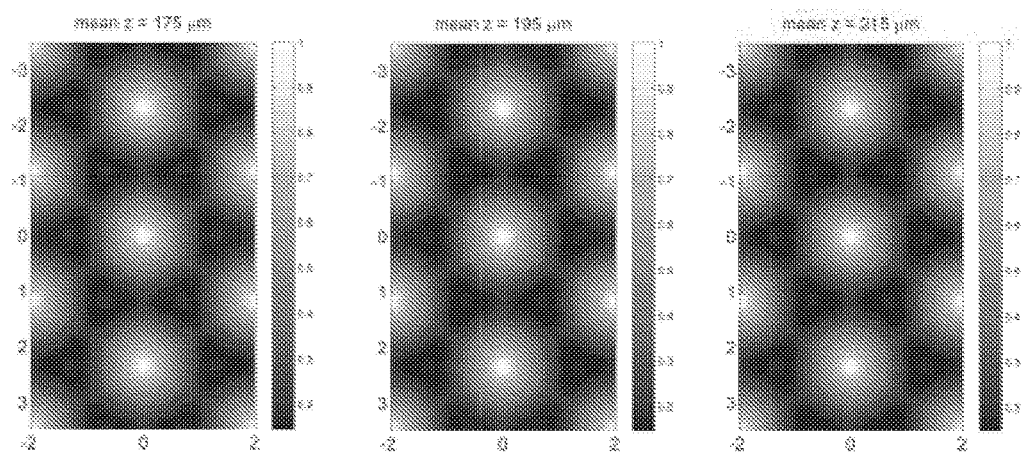
FIG. 6 shows a computer simulation of the time-integrated intensity distribution exposing a photoresist-coated wafer in the fifth embodiment.

For a hexagonal array the exposure sequence comprises 3 sub-exposures of equal dose. As in the first embodiment, the wafer 14 is firstly positioned parallel to the mask 12 and at a distance of ~200 µm. The separation is changed during each sub-exposure with a constant speed as in the first embodiment but, on account of the mask pattern 13 being a hexagonal array, it is changed by a distance of $L_T/3$, i.e. 22 µm. The speed of the displacement is selected in relation to the intensity of the beam illuminating the mask 12 so that total exposure dose delivered by the three sub-exposures is suitable for forming the desired microstructures in the particular layer of photoresist 15 employed. Following the first sub-exposure, the wafer 14 is displaced in the x direction by a distance of $\Lambda/2$, i.e. 2 µm, and in the y direction by a distance of $$\frac{\Lambda}{2\sqrt{3}},$$

i.e. 1.15 µm, and the separation between the wafer 14 and mask 12 is returned to its initial value; and following the second sub-exposure the wafer 14 is displaced so that it is offset with respect to its position for the first sub-exposure by $\Lambda/2$, i.e. 2 µm, in the x direction and by $$\frac{-\Lambda}{2\sqrt{3}},$$

i.e. −1.15 µm, in the y direction, and the separation is again returned to its initial value. The sum of the 3 time-integrated intensity distributions with these lateral offset distances may be determined by computer simulation using standard methods familiar to a skilled person in the art. For example, by determining the amplitudes and phases of the various orders diffracted by the hexagonal array in the mask 12 (this may be done analytically based on scalar theory or using commercially available software based on e.g. FDTD analysis), calculating the intensity distribution produced by the interference of these diffracted orders at different distances from the mask 12 corresponding to the range over which the separation is changed during each of the sub-exposures and the average of these distributions, and lastly summing 3 of these average distributions with the above-defined lateral offsets. The results for a unit cell of the pattern in the mask, calculated for three values of the mean separation during exposure, respectively 175, 195 and 215 µm, are shown in FIG. 6. As can be seen, the sum of the 3 distributions is a hexagonal array of intensity peaks with good contrast (~75%) and a nearest-neighbour distance that is √3 smaller than that in the mask 12. Most importantly, it can be seen that the intensity distribution is independent of the mean separation over the range of values simulated, i.e. 40 µm, which is larger than half of the Talbot distance. This distribution enables a hexagonal array of holes to be formed in a positive-tone photoresist or, alternatively, a hexagonal array of pillars to be formed in a negative-tone photoresist.

However, as for the first embodiment, the variation of separation with a constant speed requires that the separation is changed accurately by the desired distance during each sub-exposure otherwise some non-uniformity results. In variants of this embodiment, the ratio of the diameter to the nearest-neighbour distance of the holes in the mask is different from 1:2 in order to modify and optimise the profile of the intensity peaks in the sum of the 3 time-integrated intensity distributions according to the particular requirements of the applications concerned; for example, it is larger than 1:2 in order to improve the roundness of the intensity peaks with respect to that shown in FIG. 6.

In a variant of this embodiment, the same result may be alternatively obtained by changing the separation with constant speed during each sub-exposure so that the separation changes by an integer multiple of one-third of the Talbot distance where the integer is >1, but by less than one Talbot distance, in other words by two-thirds of the Talbot distance, which is 44 µm for the particular mask pattern and illumination wavelength concerned.

In view of the periodic nature of the mask pattern 13, the same printed result (neglecting the edges of the printed pattern) can be obtained if the wafer is additionally displaced between the first and second sub-exposures, and between the second and third sub-exposures, by an integer number of nearest-neighbour distances of the mask pattern in a direction of one of the 3 axes of the mask pattern (e.g. x axis) and by an integer number of nearest-neighbour distances in a direction of one of the other axes (e.g. at 60° to the x axis). The resulting lateral offsets of the time-integrated intensity distributions of the second and third sub-exposures with respect to that of the first sub-exposure can therefore be considered as entirely equivalent to those employed in this embodiment. The lateral offsets required for the second and third sub-exposures can correspondingly be more generally expressed as respectively $(2m+n+1)\Lambda/2$ and $(2p+q+1)\Lambda/2$ in the x direction and respectively $(n+\frac{1}{3})\sqrt{3}\Lambda/2$ and $(q-\frac{1}{3})\sqrt{3}\Lambda/2$ in the y direction, where m, n, p and q are integers (any of which may have the same value) and a is the nearest-neighbour distance of the mask pattern. It is, however, preferable that m, n, p and q are minimised in order to maximise the overlap of the three exposed areas of photoresist and so maximise the area of the uniformly printed pattern.

In a sixth embodiment, the same exposure system and mask are employed as in the previous embodiment. The exposure sequence likewise comprises 3 sub-exposures of equal exposure dose and the wafer 14 is displaced by the same lateral offsets between sub-exposures. Before the first sub-exposure the wafer 14 is similarly positioned parallel to the mask 12 and at a distance of ~200 µm. During the sub-exposure, however, the separation of the wafer 14 and mask 12 is instead changed with a varying speed so that the exposure dose per incremental change of separation varies during the change of separation according to a truncated Gaussian distribution. The profile of the distribution is the same as that described by equ.(4) for the second embodiment except that, on account of the mask pattern 12 being a hexagonal array, the maximum deviation of the separation either side of its mean value, $d_0$, respects the limits:

$$\frac{L_T}{6} \leq |d - d_0|_{max} < \frac{L_T}{2} \qquad \text{equ. (7)}$$

Preferably, the distance, $2|d-d_0|_{max}$, by which the separation is changed in the sub-exposure is at least $2L_T/3$ so that very good uniformity is achieved, and less than $0.9L_T$ so that it is significantly smaller than the Talbot distance. For smaller changes of separation, from $2L_T/3$ down to $L_T/3$, the uniformity of the printed pattern is progressively less good but can be still sufficient for less demanding applications. Preferably, the full width at half maximum of the Gaussian distribution, FWHM, is selected so that FWHM=$2w\approx|d-d_0|$ in order that $$\frac{\partial E_G(d)}{\partial d}$$

falls to ~6% of its peak value at the maximum and minimum values of separation. The FWHM is therefore preferably in the range $L_T/6$ to $L_T/2$ and most preferably in the range $L_T/3$ to $0.45L_T$. The distance by which the separation is changed during each sub-exposure in this embodiment is correspondingly selected to be $2L_T/3$, i.e. 44 µm, and the FWHM of the Gaussian distribution, $2w$, is selected to be $L_T/3$, i.e. 22 µm. The desired variation of the exposure dose per incremental change of separation is obtained by changing the separation with a varying speed according to equ. (5) with the above-stated values for $2|d-d_0|_{max}$ and $w$, and with $v_0$ selected in combination with the beam intensity so that the total exposure dose delivered to the photoresist 15 in the three sub-exposures is suitable for forming the desired microstructures. The integrated intensity distribution produced at the photosensitive layer 15 by the three laterally offset sub-exposures may likewise be determined by computer simulation. A similar mathematical procedure as outlined in the previous embodiment may be followed except that a weighted average should be calculated of the intensity distributions over the range of values of separation during each sub-exposure, where the weighting corresponds to the truncated Gaussian distribution. The results show substantially the same intensity distribution as illustrated in FIG. 6 for the fifth embodiment. As for the second embodiment, the advantage of this embodiment over the previous embodiment is that the truncated Gaussian variation of the exposure dose per incremental change of separation during the change of separation greatly reduces the sensitivity of the printed pattern to inaccurate longitudinal displacement of the substrate during exposure and to inexact synchronisation of the wafer displacement with mask illumination, and thus enables better uniformity and reproducibility of the printed pattern. Also analogous to the second embodiment, a similar improvement to the uniformity and reproducibility can be obtained in this embodiment by alternatively varying the exposure dose per incremental change of separation over the same range of separation according to a truncated sinusoidal, truncated triangular or similar profile.

Figure 7:
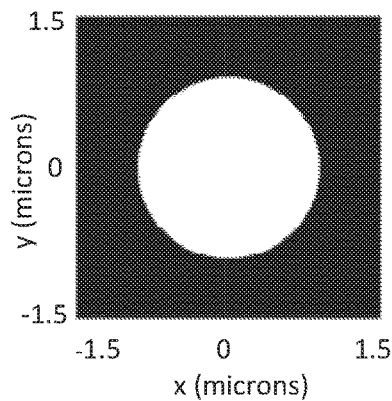
FIG. 7 illustrates a square array of holes in a mask employed in the seventh embodiment.

In a seventh embodiment, substantially the same apparatus as in the fifth embodiment is employed except that the mask 12 consists of instead a square array of holes of diameter 1.8 µm and period of 3 µm that have been formed in a layer of chrome on a fused silica substrate. A unit cell of this pattern of holes in shown in FIG. 7. Illumination of this array with the wavelength concerned produces not just 0th and 1$^{st}$ diffracted orders but up to the 8th orders (note: in the case of a square array, if the period is larger than $\sqrt{2}$ times the wavelength then at least a double-diffracted set of orders propagates in addition to the $0^{th}$ and $1^{st}$ orders). The diffracted orders interfere after the mask to produce Talbot images of the mask pattern at regular intervals from the mask. The Talbot distance, $L_T$, for a square array may be calculated from equ. (1) with k=2. Evaluating with $\lambda$=364 nm and $\Lambda$=3 µm yields $L_T$=49.5 µm.

Figure 8:
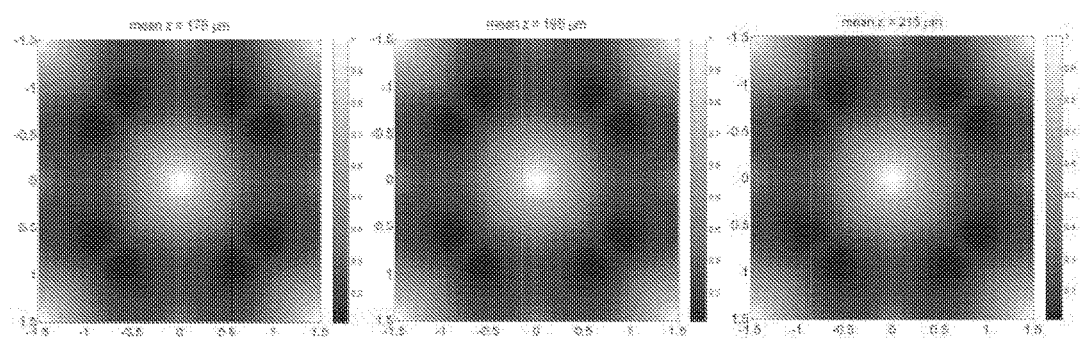
FIG. 8 shows a computer simulation of the time-integrated intensity distribution exposing a photoresist-coated wafer in the seventh embodiment.
Figure 9:
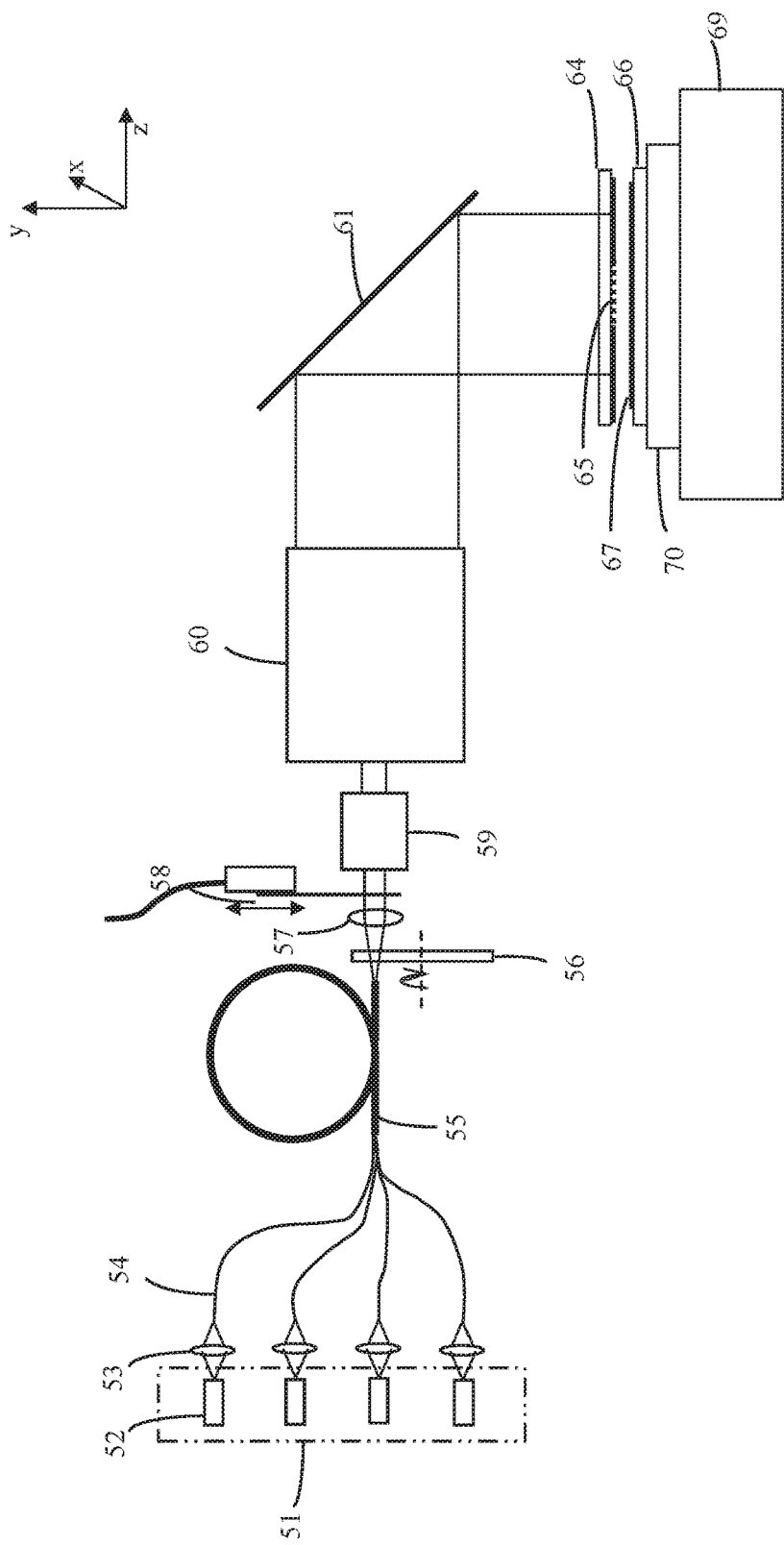
FIG. 9 illustrates an apparatus employed in the tenth embodiment of the invention.

For a square array the exposure sequence consists of 2 sub-exposures of equal dose. As for the first embodiment, the wafer 14 is firstly positioned parallel to the mask 12 and at a distance of ~200 µm. The separation between the mask 12 and wafer 14 is changed during each of the sub-exposures with a constant speed as in the first embodiment but, on account of the mask pattern 12 being a hexagonal array, it is changed by a distance of $L_T/2$, i.e. 25 µm. The speed of the displacement is selected in relation to the intensity of the beam illuminating the mask so that total exposure dose delivered by the two sub-exposures is suitable for forming the desired microstructures in the particular layer of photoresist 15 employed. Between the two sub-exposures, the wafer 14 is displaced in both x and y directions by a distance of $\Lambda/2$, i.e. 1.5 µm, and the separation between the wafer 14 and mask 12 is returned to its initial value. The sum of the two time-integrated intensity distributions with these lateral offsets may be determined by computer simulation in the same manner as the earlier embodiments. The results for a unit cell of the mask pattern 13, calculated for three values of the mean separation during each exposure, respectively 175, 195 and 215 µm, are shown in FIG. 8. The intensity distribution in each of the three plots has been normalised (i.e. a maximum value of 1) and an intensity scale is shown to the right of each plot. As can be seen, the sum of the two distributions is a square array of intensity peaks with good contrast (~80%) and a period that is $\sqrt{2}$ smaller than that of the mask pattern 13, and whose array axes are rotated by 45° with respect to those of the mask pattern 13. Most importantly, it can be seen that the intensity distribution is independent of the mean separation during exposure over the range of values simulated, i.e. 40 µm, which is just less than the Talbot distance of the light-field transmitted by the mask. This exposure scheme therefore enables a square array of holes to be printed uniformly and reproducibly into a layer of a positive-tone photoresist or, alternatively, a square array of pillars to be similarly printed into a layer of a negative-tone photoresist. However, as for the first embodiment, it requires that the separation is changed accurately by the desired distance during the exposure otherwise some non-uniformity results.

In view of the periodic nature of the mask pattern, the same printed result (neglecting the edges of the printed pattern) can be more generally obtained in this embodiment by displacing the wafer 14 between sub-exposures by a distance $(m+\frac{1}{2})\Lambda$ in the x direction and by $(n+\frac{1}{2})\Lambda$ in the y direction, where m and n are integers (which may have the same value). These displacements, and the resulting lateral offsets of the time-integrated intensity distribution of the second sub-exposure, are therefore equivalent. It is, however, preferable that m and n are minimised in order to maximise the overlap of the two exposed areas of photoresist and so maximise the area of the uniformly printed pattern.

In variants of this embodiment, the ratio of the diameter to the period of the holes in the mask is different from 0.6:1 in order to modify and optimise the profile of the intensity peaks in the sum of the 2 time-integrated intensity distributions according to the particular requirements of the applications concerned.

In an eighth embodiment, the same exposure system and mask as in the previous embodiment are employed. The exposure sequence likewise comprises 2 sub-exposures of equal exposure dose and the wafer 14 is displaced by the same lateral offsets between sub-exposures. Before the first sub-exposure the wafer 14 is likewise positioned parallel to the mask 12 and at a distance of ~200 μm. During the sub-exposure, however, the separation of the wafer 14 and mask 12 is instead changed with a varying speed so that the exposure dose per incremental change of separation varies according to a truncated Gaussian distribution. The profile of this variation is the same as that described by equ.(4) except that, on account of the mask pattern being a square array, the maximum deviation of the separation either side of its mean value, $d_0$, respects the limits:

$$\frac{L_T}{4} \le |d - d_0|_{max} < \frac{L_T}{2} \qquad \text{equ. (8)}$$

Preferably, the distance, $2|D-d_0|_{max}$, by which the separation is changed in the sub-exposure is at least $3L_T/4$ so that good uniformity is achieved, and less than $0.9L_T$ so that it is significantly smaller than the Talbot distance. For smaller changes of separation, from $3L_T/4$ down to $L_T/2$, the uniformity of the printed pattern is progressively less good but can be still sufficient for less demanding applications. Preferably, the full width at half maximum of the Gaussian distribution, FWHM, is selected so that FWHM=$2w \approx |d-d_0|$ in order that $$\frac{\partial E_G(d)}{\partial d}$$

falls to ~6% of its peak value at the maximum and minimum values of separation. The FWHM is therefore preferably in the range $L_T/4$ to $L_T/2$ and most preferably in the range $3L_T/8$ to $0.45L_T$. The distance by which the separation is changed during each sub-exposure in this embodiment is correspondingly selected to be $0.8L_T$, i.e. 41 μm, and the FWHM of the Gaussian distribution, $2w$, is selected to be $0.4L_T$, i.e. 20 μm. The desired variation of the exposure dose per incremental change of separation is obtained by changing the separation with a varying speed according to equ. (5) with the above-stated values for $2|d-d_0|_{max}$ and $w$, and with $v_0$ selected in combination with the beam intensity so that the total exposure dose delivered to the photoresist 15 in the two sub-exposures is suitable for forming the desired microstructures. The total time-integrated intensity distribution produced at the photosensitive layer by the two laterally offset sub-exposures is determined by computer simulation to be substantially the same as illustrated in FIG. 8 for the seventh embodiment. The advantage of this embodiment, like the second embodiment, is that the truncated Gaussian variation of the exposure dose per incremental change of separation greatly reduces the sensitivity of the printed pattern to inaccurate longitudinal displacement of the substrate 14 during exposure and to inexact synchronisation of the wafer displacement with mask illumination, and thus enables better uniformity and reproducibility of the printed pattern.

In the above fifth to eighth embodiments describing the application of the invention to two-dimensional periodic patterns of features, the lateral offsets of the time-integrated intensity distribution at the photoresist for the different sub-exposures are obtained by displacing the wafer 14 between sub-exposures. Clearly, as for the one-dimensional grating pattern employed in the earlier embodiments, the same offsets may be alternatively and substantially equivalently obtained in other embodiments by either changing the angle of the beam 11 illuminating the mask from one sub-exposure to the next, or by simultaneously illuminating the mask with collimated beams at different angles of incidence in a single exposure (or a mixture of these equivalent techniques may be employed, for example, displacing the wafer between sub-exposures for obtaining a lateral offset in x and changing the angle of the illumination beam between sub-exposures for obtaining a lateral offset in y). Concerning the former, substantially the same mask illumination system as that illustrated in FIG. 1 for the third embodiment may be employed except that the tilt stage 10 for the mirror 11 should enable the angle of incidence of the beam 33 illuminating the mask 34 to be adjusted in both xz and yz planes with an angular resolution of ~0.1 mR. An exposure procedure analogous to that of the third embodiment is then employed in which the angle of the mirror 11 is adjusted between the sub-exposures in order to obtain the required lateral offsets in both x and y directions of the time-integrated intensity distributions of the different sub-exposures at the photoresist 15. Concerning the simultaneous illumination of the mask at different angles, substantially the same mask illumination system as that illustrated in FIG. 4 for the fourth embodiment may be employed except that the optical configuration between the mirror 34 and the large mirror 41 should be modified in order that 3 beams of light for the hexagonal array, or 2 beams for the square array, are formed and focussed to points that are offset in both x and y directions in the front focal plane of the collimating lens 42 so that the mask 44 is simultaneously illuminated with respectively 3 or 2 beams of collimated light that are angularly offset in both xz and yz planes. In the case of the hexagonal array such a modification may comprise adding a further beam-splitter, another mirror, another continuously variable filter and another focussing lens and configuring them, as could be readily determined by one skilled in the art, so that three beams of light are focussed to 3 points at the vertices of an equilateral triangle in the front focal plane of lens 42, the size and orientation of the triangle being such that the resulting 3 beams of collimated light after lens 42 illuminate the mask pattern 45 with the angular offsets in the xz and yz planes necessary for obtaining the desired lateral offsets of the time-integrated intensity distributions at the photoresist 47. In the case of the square array, a re-arrangement of the same optical components shown in FIG. 4 so that the lenses 39, 40 focus the two beams to points that are offset by the same distance in both x and y directions would suffice, the distance being such that the resulting 2 beams of collimated light after lens 42 illuminate the mask pattern 45 with the angular offsets in the xz and yz planes necessary for obtaining the desired lateral offsets of the time-integrated intensity distributions at the photoresist 47. For both hexagonal and square arrays, the same exposure procedure as described in the fourth embodiment may be employed.

It is evident that in variants of any of the above embodiments, the variation of separation during the exposure may be alternatively and equivalently obtained by longitudinally displacing the mask instead of the wafer. This may be achieved by modifying the apparatus of the embodiment concerned so that the mask is, for example, held by a vacuum chuck that is mounted to a positioning system having the same or similar fine-positioning actuators that are connected to the control system.

In other variants of any of the above embodiments, the changing of the separation with a constant or varying speed during a sub-exposure may be repeated once or a number of times for the sub-exposure with the separation between mask and wafer preferably being returned to its initial value between sub-exposures, or alternatively the direction of the changing separation is reversed for each sub-exposure. In such variants the intensity of the beam illuminating the mask should be reduced in inverse proportion to the number of repetitions so that the time-integrated intensity distribution produced by the complete exposure is suitable for forming the desired micro-structures in the photoresist.

It is further evident that in variants of the first, second, fifth, sixth, seventh and eighth embodiments that the lateral displacement of the wafer with respect to the mask between sub-exposures may be alternatively and equivalently obtained by laterally displacing the mask. This may be achieved by modifying the apparatus of the embodiment concerned so that the mask is, for example, held by a vacuum chuck that is mounted to a positioning system having the same or similar fine-positioning actuators for the lateral displacement.

Whereas in the above embodiments only two types of laser are employed, both of which emit at near-UV wavelengths, in other embodiments of the invention other laser sources emitting at other wavelengths in the same or other spectral regions may be alternatively employed in combination with suitable optics, masks and photoresists. Other substantially monochromatic light sources may be alternatively be used such as EUV sources, or a discharge lamps (e.g. mercury/xenon) whose output is spectrally filtered to a produce single narrow line.

In a ninth embodiment, substantially the same apparatus as illustrated in FIG. 1 for the first embodiment is employed except that the laser source 1 is a wavelength-tuneable titanium-sapphire laser oscillator (for instance, a Mai Tai system manufactured by Newport/Spectra-Physics that includes a Millennia series diode-pumped solid-state laser for pumping the oscillator) and a frequency-doubling module (for instance, an Inspire Blue module also manufactured by Newport/Spectra-Physics) that halves the beam's wavelength by second harmonic generation (SHG). The beam from the laser oscillator has an approximately circular cross-section with a diameter ~1 mm and a Gaussian intensity profile, and the light is delivered in pulses with a frequency of 80 MHz. The particular feature of this laser is that its wavelength can be tuned over a range 690-1040 nm, so after the frequency doubling module it is tuneable over the range 345-520 nm. The laser oscillator and the frequency-doubling module are connected to a control system 5 that enable the beam's wavelength to be automatically scanned or stepped across a part or the whole of this range. The frequency-doubled beam at a wavelength of ~400 nm from the laser source 1 passes through essentially the same optical system as depicted in FIG. 1, so that an expanded beam with substantially uniform intensity illuminates a mask 12 at normal incidence. As in the first embodiment the mask has a phase grating on its lower surface with a period of 4 μm, and below the mask is a photoresist coated wafer on a vacuum chuck that is mounted to a positioning system with fine-positioning actuators enabling the wafer to be accurately displaced in the x direction.

The wafer is firstly arranged parallel to the mask and separated from it by ~400 μm. As in the first embodiment, two sub-exposures are then performed with the wafer being laterally displaced between the two sub-exposures by half of the period of the mask grating, i.e. by 2 μm, in the direction orthogonal to the grating lines. During each sub-exposure, however, the mask-wafer separation is not changed but the lasing wavelength of the oscillator 1 is instead scanned at a constant rate across a certain range. Changing the wavelength of the mask illumination changes the angles of the orders diffracted by the periodic mask pattern, which changes the Talbot distance between self-image planes in the light-field after the mask (as described by equ.(1)); in other words, it causes the transverse intensity distributions in the light-field to displace longitudinally with respect to the mask. From the wafer's perspective, therefore, changing the wavelength and changing the mask-wafer separation are equivalent. The change of wavelength, $\Delta\lambda$, required to achieve the same variation of the intensity distribution at the wafer as produced by changing the mask-wafer separation by N Talbot distances is given by:

$$\Delta\lambda = \frac{2N\Lambda^2}{d} \qquad \text{equ. (9)}$$

So, for a grating period, $\Lambda=4$ μm and a wafer-mask separation, d=400 μm, the change of wavelength required to produce the same printed result as that obtained in the first embodiment, in which the separation was changed during each sub-exposure by N=one quarter, is calculated using equ. (9) to be 20 nm (it should be noted that this is only one quarter of the bandwidth required by ATL of the prior art, as given by equ. 2, so is more easily achieved). The output wavelength of the laser 1 is correspondingly scanned with a constant speed from 390 nm to 410 nm during each of the sub-exposures, the speed being selected so that the time-integrated exposure dose is suitable for forming the required periodic microstructure in the developed photoresist.

In a variant of this embodiment, the wavelength may be alternatively scanned with a varying speed across a larger range but less than that given by equ. (2) (and preferably less than 0.9 times that given by equ. (2)) such that the exposure dose per incremental change of wavelength varies according to a Gaussian or similar profile equivalent to that described in the second embodiment in order that the sensitivity of the printed pattern to an inexact scan of wavelength scan or to inaccurate adjustment of the mask-wafer separation before the sub-exposures is similarly reduced. The variation required of the exposure dose per incremental change of wavelength may be derived straightforwardly from equs. (4) and (5) and the equivalence relationship defined in equ. (9).

In other variants of this embodiment, other types of laser source whose wavelength may be similarly scanned across a range may be may be alternatively employed, for example, a laser diode whose emission wavelength may be varied to some extent by adjusting its drive current or temperature.

In a related tenth embodiment, with reference to FIG. 5, an illumination source 51 comprises an array of four diode lasers each with its own driver circuitry (not shown). The lasers emit beams with an elliptical cross section, each with a spectral width of 1 nm and having central wavelengths of respectively 403 nm, 404 nm, 405 nm and 406 nm. The beam from each of the lasers 52 is coupled by a lens 53 into an optical fibre 55 having a core diameter of 50 μm and an NA of 0.2 (the lens is only shown schematically in the figure: the light may be coupled using, for example, a multi-element lens, an anamorphic lens or a GRIN lens). The output ends of the fibres 54 form a bundle and the combined emitted light from the four fibers 54 is coupled into a single fibre 55 having a larger core diameter of 400 μm and an NA of 0.2. The output powers of the four lasers 52 are individually adjusted using their driver circuitry so that spectral distribution of power of the total light coupled out of the fibre 55 is substantially flat with a FWHM of 4 nm. The fibre 55 is coiled so that the angular distribution of the output beam is axially symmetric with an approximately Gaussian intensity profile and a FWHM of ~10°. The divergent beam passes through a diffuser 56 with small scattering angle of ~1° that is mounted to a motor (not shown) for rotating the diffuser about its normal during the exposure. The light transmitted by the diffuser is collimated by a lens 57 and then incident on a refractive beam transformer 59 that produces a collimated output beam with a substantially uniform intensity distribution. This is then enlarged by a beam expander 60, reflected by a mirror 61 and illuminates a mask 64 at normal incidence. The expansion of the beam expander 60 is selected so that the FWHM of the range of angles of the rays illuminating each point of the mask is <0.35 mR. Owing to the coherent nature of the light emitted by each of the lasers 52, the intensity distribution of the beam at the output end of the fibre 55 and the instantaneous intensity distribution of the beam illuminating the mask are modulated by fine speckle patterns. The inclusion of the rotating diffuser 58 in the beam path serves to average out the speckle pattern during the exposure so that the time-integrated intensity distribution illuminating the mask 61 is speckle free. On the lower surface of the mask is a linear phase grating with a period of 1.6 µm, and below the mask is a photoresist-coated wafer on a vacuum chuck that is mounted to a positioning system having fine-positioning actuators for displacing the wafer in the x direction.

As in the previous embodiment, two sub-exposures are performed with the wafer being laterally displaced between the two sub-exposures by half of the period of the mask grating, i.e. by 0.8 µm, in the direction orthogonal to the grating lines, and the separation between the mask and wafer is kept constant during each sub-exposure. However, the time-integrated intensity distribution at the wafer obtained in the previous embodiment by scanning the wavelength of the illumination beam during each sub-exposure may be produced instantaneously in this embodiment because of the spectral width of the light illuminating the mask. Equ. (9) is therefore also applicable except that $\Delta\lambda$ refers instead to the spectral width of the illumination beam. In view of the 4 nm spectral width of the beam and the 1.6 µm period of the grating (and N=0.25 as in the previous embodiment), the separation between the wafer and mask is pre-adjusted to ~320 µm for the two sub-exposures so that the intensity distribution illuminating the wafer has the desired insensitivity to deviations of the separation from this value. It should be noted that this distance is only one quarter of that required by ATL, as given by equ. 2, so significantly reduces the blurring of the printed pattern caused by imperfect collimation of the mask illumination, thereby enabling a correspondingly higher resolution of printed features.

In a variant of this embodiment, the number, central wavelengths, spectral widths and relative output powers of the diode lasers in the light source are selected so that the spectral distribution of the total output power has a Gaussian or similar profile of appropriate width equivalent to that employed in the second embodiment (using the equivalence relationship of equ. 9) so that the intensity distribution illuminating the wafer has a greater insensitivity to inexact adjustment of the wafer-mask separation and to inexact generation of the desired distribution of spectral power.

It is evident that in variants of the $9^{th}$ and $10^{th}$ embodiments, the lateral offset between the time-integrated intensity distributions of the two sub-exposures at the photosensitive layer may be alternatively $(n+\frac{1}{2})\Lambda$, where n is an integer, in the direction orthogonal to the grating lines (i.e. analogously to variants of the first embodiment).

It is evident that the teaching of the ninth and tenth embodiments may be applied to two-dimensional periodic patterns. In the cases of hexagonal and square arrays of features, the corresponding value required of N in equ. (9) to obtain substantially the same printed results as in the fifth and seventh embodiments is respectively one third and one half.

Whereas in the ninth and tenth embodiments the lateral offsets between the time-integrated intensity distributions of the two sub-exposures at the wafer is obtained by displacing the wafer with respect to the mask between the two sub-exposures, it is evident that in other embodiments the lateral offsets may be obtained by instead changing the angle of the illumination beam between sub-exposures in an analogous manner to that employed in the third embodiment, or alternatively by simultaneously illuminating the mask with two beams of collimated light at different angles of incidence in an analogous manner to that employed in the fourth embodiment.

Whereas in all of the above embodiments only one means is described and depicted for homogenising the intensity of the beam illuminating the mask, namely a refractive beam transformer, it should be understood that in other embodiments other standard means of homogenisation may be alternatively employed to obtain a substantially uniform exposure of the mask. For example, a light-pipe or a scanning system may be employed. On the other hand, if the intensity distribution emitted by the light source is sufficiently uniform then no homogenising means would be necessary.

The mirrors shown just before the mask or just before the final collimating lens in FIGS. 1, 4 and 5 are not an essential feature but are a convenient means for adjusting the angle of the beam illuminating the mask, in particular to arrange it at or near normal incidence and for changing the angle of the beam between sub-exposures. Such an adjustment of the angle of the illumination beam may be alternatively achieved in other embodiments without such a mirror by, for example, tilting the complete illumination sub-system with respect to the mask and wafer sub-system, or vice versa, using suitable tilting means, or by displacing the final collimating lens in the plane of the lens.

Whereas in all of the above embodiments the same exposure dose is used for each sub-exposure, in other embodiments of the invention optimal printed results may be obtained by some fine-tuning of the relative dose(s) of the different sub-exposures. For example, the dose may be slightly increased from one sub-exposure to the next in order compensate for small changes to the photochemistry, absorption or sensitivity of the photosensitive layer that is produced by each sub-exposure. Such a change in exposure dose between sub-exposures may be obtained by adjusting either the beam intensity or the mean speed of the change of separation.

Whereas the features in all the two-dimensional arrays employed in the above embodiments are circular holes, in other embodiments the holes may have other shapes, for example, square. Further, each element of the periodic array is not necessarily restricted to a single feature but may be a combination of features, which together repeat with a period across the array. Yet further, in the case of an amplitude mask, the periodic feature is not necessarily a hole in a layer of chrome but may have the opposite polarity, i.e. be a chrome feature on a transparent substrate. Additionally, whereas in the various embodiments particular values are

The invention claimed is:

1. A method for printing a desired one-dimensional periodic pattern into a photosensitive layer, the method comprising:
   a) providing a mask formed with a periodic mask pattern of linear features having a period that is twice a period of the desired one-dimensional periodic pattern;
   b) providing a substrate bearing the photosensitive layer;
   c) placing the substrate parallel to the mask and in proximity to the mask;
   d) providing at least one illumination beam of collimated monochromatic light and illuminating the mask pattern to generate a transmitted light-field described by a Talbot distance;
   e) exposing the photosensitive layer to a time-integrated intensity distribution of a first sub-exposure and a time-integrated intensity distribution of a second sub-exposure, wherein the first and second time-integrated intensity distributions are substantially equal and are formed by illuminating the mask pattern with the at least one beam while changing a separation between the substrate and the mask by a distance that is at least one quarter of the Talbot distance but less than the Talbot distance;
   f) configuring the at least one beam or lateral positions of the substrate relative to the mask for the first and second sub-exposures so that the exposures of the photosensitive layer by the time-integrated intensity distributions of the first and second sub-exposures are mutually laterally offset by a distance of half of the period of the mask pattern, or by an equivalent distance, in a direction orthogonal to the linear features;
   wherein the period of the mask pattern is greater than twice a wavelength of the at least one illumination beam.

2. The method according to claim 1, wherein the at least one illumination beam is a single beam and the method comprises performing the sub-exposures sequentially, and configuring the lateral position of the substrate relative to the mask by changing the lateral position between the sub-exposures.

3. The method according to claim 1, wherein the at least one illumination beam is a single beam and the method comprises performing the sub-exposures sequentially, and changing an angle of incidence of the illumination beam on the mask between the sub-exposures.

4. The method according to claim 1, which comprises performing the sub-exposures simultaneously and using a plurality of illumination beams of collimated light that are superposed at the mask and have different angles of incidence.

5. The method according to claim 1, which comprises changing the separation between the substrate and the mask by respectively one quarter of the Talbot distance, one third of the Talbot distance and one half of the Talbot distance, and changing the separation between the substrate and the mask with a constant speed during the sub-exposures.

6. The method according to claim 1, which comprises changing the separation between the substrate and the mask by at least one quarter, one third and one half of the Talbot distance respectively, and changing the separation between the substrate and the mask with a variable speed during the sub-exposures.

7. The method according to claim 1, which comprises changing the separation between the sub-exposures by at least one quarter of the Talbot distance, one third of the Talbot distance and one half of the Talbot distance respectively, and changing the separation between the substrate and the mask with a variable speed during the sub-exposures such that the exposure energy density per incremental change of separation varies during the change of separation according to a substantially Gaussian distribution.

8. The method according to claim 1, which comprises changing the separation between the substrate and the mask with a variable speed during the sub-exposures such that an exposure energy density per incremental change of separation varies during the change of separation according to a substantially Gaussian distribution whose full width at half maximum is at least one eighth, one sixth and one quarter, respectively, of the Talbot distance.

9. A method for printing a desired two-dimensional periodic pattern of features in a hexagonal array into a photosensitive layer, the method comprising:
   a) providing a mask formed with a periodic mask pattern of features in a hexagonal array having a nearest-neighbor distance that is $\sqrt{3}$ times greater than a nearest-neighbor distance of the desired two-dimensional pattern;
   b) providing a substrate bearing the photosensitive layer;
   c) placing the substrate parallel to the mask and in proximity to the mask;
   d) providing at least one illumination beam of collimated monochromatic light and illuminating the mask pattern to generate a transmitted light-field described by a Talbot distance;
   e) exposing the photosensitive layer to a time-integrated intensity distribution of a first sub-exposure, a time-integrated intensity distribution of a second sub-exposure and a time-integrated intensity distribution of a third sub-exposure, wherein the first, second and third time-integrated intensity distributions are substantially equal to one another and are each formed by illuminating the mask pattern with the at least one illumination beam while changing a separation between the substrate and the mask by a distance that is at least one third of the Talbot distance but less than the Talbot distance;
   f) configuring the at least one illumination beam or lateral positions of the substrate relative to the mask for the first, second and third sub-exposures so that the exposures of the photosensitive layer by the time-integrated intensity distributions of the second and third sub-exposures are both laterally offset from the exposure of the photosensitive layer by the time-integrated intensity distribution of the first sub-exposure by half the nearest-neighbor distance of the mask pattern, or by equivalent distances, in a direction parallel to a row of features in the mask pattern, and are laterally offset by respectively $1/(2\sqrt{3})$ and $-1/(2\sqrt{3})$ times the nearest-neighbor distance of the mask pattern, or by equivalent distances, in a direction orthogonal to the row of mask features;

wherein the nearest-neighbor distance of the mask pattern is greater than twice a wavelength of the at least one illumination beam.

10. The method according to claim 9, wherein the at least one illumination beam is a single beam and the method comprises performing the sub-exposures sequentially, and configuring the lateral position of the substrate relative to the mask by changing the lateral position between the sub-exposures.

11. The method according to claim 9, wherein the at least one illumination beam is a single beam and the method comprises performing the sub-exposures sequentially, and changing an angle of incidence of the illumination beam on the mask between the sub-exposures.

12. The method according to claim 9, which comprises performing the sub-exposures simultaneously and using a plurality of illumination beams of collimated light that are superposed at the mask and have different angles of incidence.

13. The method according to claim 9, which comprises changing the separation between the substrate and the mask by respectively one quarter of the Talbot distance, one third of the Talbot distance and one half of the Talbot distance, and changing the separation between the substrate and the mask with a constant speed during the sub-exposures.

14. The method according to claim 9, which comprises changing the separation between the substrate and the mask by at least one quarter, one third and one half of the Talbot distance respectively, and changing the separation between the substrate and the mask with a variable speed during the sub-exposures.

15. The method according to claim 9, which comprises changing the separation between the sub-exposures by at least one quarter of the Talbot distance, one third of the Talbot distance and one half of the Talbot distance respectively, and changing the separation between the substrate and the mask with a variable speed during the sub-exposures such that the exposure energy density per incremental change of separation varies during the change of separation according to a substantially Gaussian distribution.

16. The method according to claim 9, which comprises changing the separation between the substrate and the mask with a variable speed during the sub-exposures such that an exposure energy density per incremental change of separation varies during the change of separation according to a substantially Gaussian distribution whose full width at half maximum is at least one eighth, one sixth and one quarter, respectively, of the Talbot distance.

17. A method for printing a desired two-dimensional periodic pattern of features in a square array into a photosensitive layer, the method comprising:
a) providing a mask formed with a periodic mask pattern of features in a square array having a period that is $\sqrt{2}$ times greater than a period of the desired two-dimensional pattern;
b) providing a substrate bearing the photosensitive layer;
c) placing the substrate parallel to the mask and in proximity to the mask;
d) providing at least one illumination beam of collimated monochromatic light and illuminating the mask pattern to generate a transmitted light-field having a Talbot distance;
e) exposing the photosensitive layer to a time-integrated intensity distribution of a first sub-exposure and to a time-integrated intensity distribution of a second sub-exposure, wherein the first and second time-integrated intensity distributions are substantially equal and are formed by illuminating the mask pattern with the at least one illumination beam while changing a separation between the substrate and mask by a distance that is at least one half of the Talbot distance but less than the Talbot distance;
f) configuring the at least one illumination beam, or lateral positions of the substrate relative to the mask, for the first and second sub-exposures so that exposures of the photosensitive layer by the time-integrated intensity distributions of the first and second sub-exposures are mutually laterally offset by half of the period of the mask pattern, or by an equivalent distance, in a direction parallel to a row of features in the mask pattern and by half of the period of the mask pattern, or by an equivalent distance, in a direction orthogonal to the row of mask features;
wherein the period of the mask pattern is greater than $\sqrt{2}$ times a wavelength of the at least one illumination beam.

18. The method according to claim 17, wherein the at least one illumination beam is a single beam and the method comprises performing the sub-exposures sequentially, and configuring the lateral position of the substrate relative to the mask by changing the lateral position between the sub-exposures.

19. The method according to claim 17, wherein the at least one illumination beam is a single beam and the method comprises performing the sub-exposures sequentially, and changing an angle of incidence of the illumination beam on the mask between the sub-exposures.

20. The method according to claim 17, which comprises performing the sub-exposures simultaneously and using a plurality of illumination beams of collimated light that are superposed at the mask and have different angles of incidence.

21. The method according to claim 17, which comprises changing the separation between the substrate and the mask by respectively one quarter of the Talbot distance, one third of the Talbot distance and one half of the Talbot distance, and changing the separation between the substrate and the mask with a constant speed during the sub-exposures.

22. The method according to claim 17, which comprises changing the separation between the substrate and the mask by at least one quarter, one third and one half of the Talbot distance respectively, and changing the separation between the substrate and the mask with a variable speed during the sub-exposures.

23. The method according to claim 17, which comprises changing the separation between the sub-exposures by at least one quarter of the Talbot distance, one third of the Talbot distance and one half of the Talbot distance respectively, and changing the separation between the substrate and the mask with a variable speed during the sub-exposures such that the exposure energy density per incremental change of separation varies during the change of separation according to a substantially Gaussian distribution.

24. The method according to claim 17, which comprises changing the separation between the substrate and the mask with a variable speed during the sub-exposures such that an exposure energy density per incremental change of separation varies during the change of separation according to a substantially Gaussian distribution whose full width at half maximum is at least one eighth, one sixth and one quarter, respectively, of the Talbot distance.

25. A method for printing a desired one-dimensional periodic pattern into a photosensitive layer, the method comprising:

a) providing a mask formed with a periodic mask pattern of linear features having a period that is twice a period of the desired one-dimensional periodic pattern;
b) providing a substrate bearing the photosensitive layer;
c) providing at least one illumination beam of collimated light having a spectral bandwidth or a wavelength that can be varied over a spectral bandwidth;
d) placing the substrate parallel to the mask and with a separation that is greater than one quarter of, and less than, the distance at which a stationary image would be formed by illuminating the mask pattern with the at least one illumination beam having the spectral bandwidth;
e) exposing the photosensitive layer to a time-integrated intensity distribution of a first sub-exposure and to a time-integrated intensity distribution of a second sub-exposure, wherein the first and second time-integrated intensity distributions are substantially equal and are formed either by illuminating the mask pattern with the at least one beam of collimated light having the spectral bandwidth, or by illuminating the mask pattern with the at least one beam of collimated light having a wavelength and scanning the wavelength over the spectral bandwidth;
f) configuring the at least one illumination beam, or lateral positions of the substrate relative to the mask, for the first and second sub-exposures so that the exposures of the photosensitive layer by the time-integrated intensity distributions of the first and second sub-exposures are mutually laterally offset by a distance of half the period of the mask pattern, or by an equivalent distance, in a direction orthogonal to the linear features;
wherein the period of the mask pattern is greater than twice a central wavelength of the at least one illumination beam.

26. A method for printing a desired two-dimensional periodic pattern of features in a hexagonal array into a photosensitive layer, the method including:
a) providing a mask formed with a periodic mask pattern of features in a hexagonal array having a nearest-neighbor distance that is $\sqrt{3}$ times greater than a nearest-neighbor distance of the desired two-dimensional pattern;
b) providing a substrate bearing the photosensitive layer;
c) providing at least one illumination beam of collimated light having a spectral bandwidth or a wavelength that can be varied over a spectral bandwidth;
d) placing the substrate parallel to the mask and with a separation that is greater than one third of, and less than, a distance at which a stationary image would be formed by illuminating the mask pattern with the at least one beam having the spectral bandwidth;
e) exposing the photosensitive layer to a time-integrated intensity distribution of a first sub-exposure, a time-integrated intensity distribution of a second sub-exposure and a time-integrated intensity distribution of a third sub-exposure, wherein the first, second and third time-integrated intensity distributions are substantially equal and are formed by illuminating the mask pattern with the at least one beam of collimated light having the spectral bandwidth, or by illuminating the mask pattern with the at least one beam of collimated light having a wavelength and by scanning the wavelength over the spectral bandwidth;
f) configuring the at least one illumination beam, or lateral positions of the substrate relative to the mask, for the first, second and third sub-exposures so that the exposures of the photosensitive layer by the intensity distributions of the second and third sub-exposures are laterally offset from the exposure of the photosensitive layer by the intensity distribution of the first sub-exposure by half the nearest-neighbor distance of the mask pattern, or by equivalent distances, in a direction parallel to a row of features in the mask pattern, and by respectively $1/(2\sqrt{3})$ and $-1/(2\sqrt{3})$ times the nearest-neighbor distance of the mask pattern, or by equivalent distances, in a direction orthogonal to the row of mask features;
wherein the nearest-neighbor distance of the mask pattern is greater than twice a wavelength of the at least one illumination beam.

27. A method for printing a desired two-dimensional periodic pattern of features in a square array into a photosensitive layer, the method comprising:
a) providing a mask formed with a periodic mask pattern of features in a square array whose period is $\sqrt{2}$ times greater than the period of the desired two-dimensional pattern;
b) providing a substrate bearing the photosensitive layer;
c) providing at least one beam of collimated light having a spectral bandwidth or a wavelength that can be varied over a spectral bandwidth;
d) placing the substrate parallel to the mask and with a separation from the mask that is greater than one half of, and less than, a distance at which a stationary image would be formed by illuminating the mask pattern with the at least one beam having the spectral bandwidth;
e) exposing the photosensitive layer to a time-integrated intensity distribution of a first sub-exposure and a time-integrated intensity distribution of a second sub-exposure, wherein the first and second time-integrated intensity distributions are substantially equal and are formed by illuminating the mask pattern with the at least one beam of collimated light having the spectral bandwidth, or by illuminating the mask pattern with the at least one beam of collimated light having a wavelength and scanning the wavelength over the spectral bandwidth;
f) configuring the at least one beam or a lateral position of the substrate relative to the mask so that the exposures of the photosensitive layer by the intensity distributions of the first and second sub-exposures are laterally offset from one another by half of the period of the mask pattern, or by an equivalent distance, in a direction parallel to a row of features in the mask pattern and by half of a period of the mask pattern, or by an equivalent distance, in a direction orthogonal to the row of mask features;
wherein the period of the mask pattern is greater than $\sqrt{2}$ times a wavelength of the at least one illumination beam.

* * * * *